(12) United States Patent
Maeda et al.

(10) Patent No.: US 11,471,987 B2
(45) Date of Patent: Oct. 18, 2022

(54) ELECTROSTATIC CHUCK DEVICE AND ELECTROSTATIC CHUCK DEVICE MANUFACTURING METHOD

(71) Applicant: SUMITOMO OSAKA CEMENT CO., LTD., Tokyo (JP)

(72) Inventors: Keisuke Maeda, Tokyo (JP); Masaki Ozaki, Tokyo (JP); Masayuki Shiojiri, Tokyo (JP); Takeshi Watanabe, Tokyo (JP); Shinichi Maeta, Tokyo (JP); Yuuki Kinpara, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 0 days.

(21) Appl. No.: 17/264,705

(22) PCT Filed: Aug. 2, 2019

(86) PCT No.: PCT/JP2019/030485
§ 371 (c)(1),
(2) Date: Jan. 29, 2021

(87) PCT Pub. No.: WO2020/027322
PCT Pub. Date: Feb. 6, 2020

(65) Prior Publication Data
US 2021/0308812 A1 Oct. 7, 2021

(30) Foreign Application Priority Data
Aug. 2, 2018 (JP) .............................. JP2018-146324

(51) Int. Cl.
*B23Q 3/15* (2006.01)
*H01J 37/32* (2006.01)
*H01L 21/683* (2006.01)

(52) U.S. Cl.
CPC .......... *B23Q 3/15* (2013.01); *H01J 37/32642* (2013.01); *H01J 37/32715* (2013.01); *H01L 21/6833* (2013.01)

(58) Field of Classification Search
CPC .......... H01L 21/6833; H01L 21/67109; H01L 21/3065; H01L 21/6831; H01L 21/68735;
(Continued)

(56) References Cited

U.S. PATENT DOCUMENTS

2017/0287764 A1 10/2017 Kouno et al.
2018/0182635 A1* 6/2018 Tsukahara ........... C23C 16/4585

FOREIGN PATENT DOCUMENTS

JP 2002-033376 A 1/2002
JP 2012-134375 A 7/2012
(Continued)

OTHER PUBLICATIONS

International Search Report for PCT/JP2019/030485 (dated Oct. 29, 2019).

*Primary Examiner* — Kevin J Comber
(74) *Attorney, Agent, or Firm* — Merchant & Gould P.C.

(57) ABSTRACT

An electrostatic chuck device comprising a mounting table having a mounting surface, a focus ring; and a cooling element, wherein the mounting table has a holding portion surrounding the mounting surface, the holding portion has an annular groove portion having a through-hole, the holding portion has inner and outer peripheral surfaces which hold the focus ring and are located on both sides of the groove portion, the holding surface satisfies conditions (i) and (ii), (i) a straight line connecting a first point corresponding to an innermost periphery of the holding surface and a second point corresponding to an outermost periphery of the holding surface has a positive or a negative inclination from the innermost periphery toward the outermost periphery, wherein a difference between a height of the first point
(Continued)

and a height of the second point is 0 μm to 10 μm, and (ii) leak areas of the inner peripheral surface and the outer peripheral surface are less than 0.7 mm².

20 Claims, 9 Drawing Sheets

(58) Field of Classification Search
 CPC .. H01J 37/32715; H01J 37/32642; B23Q 3/15
 USPC .................................................. 361/233, 234
 See application file for complete search history.

(56) References Cited

FOREIGN PATENT DOCUMENTS

| | | | | |
|---|---|---|---|---|
| JP | 2017-130687 A | | 7/2017 | |
| JP | 2017130687 A | * | 7/2017 | ............... B23Q 3/15 |
| JP | 2018-107433 A | | 7/2018 | |

* cited by examiner

ELECTROSTATIC CHUCK DEVICE AND ELECTROSTATIC CHUCK DEVICE MANUFACTURING METHOD

TECHNICAL FIELD

The present invention relates to an electrostatic chuck device and an electrostatic chuck device manufacturing method.

The present application is a U.S. National Stage Application under 35 U.S.C. § 371 of International Patent Application No. PCT/JP2019/030485, filed on Aug. 2, 2019, which claims benefit of priority to Japanese Patent Application No. 2018-146324 filed in Japan on Aug. 2, 2018, the disclosures of all of which are hereby incorporated by reference in their entireties.

BACKGROUND

In the related art, in a plasma etching apparatus which is used in a semiconductor manufacturing process, an electrostatic chuck device capable of mounting and fixing a wafer (plate-shaped sample) on a sample table (mounting table) and maintaining the wafer at a desired temperature is used. This electrostatic chuck device is provided with a ring member (focus ring) disposed at an outer peripheral edge portion of a wafer attraction portion to surround a wafer mounting surface at an upper portion.

In the plasma etching apparatus of the related art, if the wafer fixed to the mounting table of the electrostatic chuck device is irradiated with plasma for etching, the surface temperature of the wafer rises. Therefore, in order to suppress a rise in the surface temperature of the wafer, a cooling medium is circulated through a temperature adjustment base part of the electrostatic chuck device to cool the wafer from the lower side.

Further, if the wafer is irradiated with plasma, the surface temperature of the focus ring also rises similar to the wafer. Due to this rise, a temperature difference occurs between the temperature adjustment base part described above and the focus ring, and as a result, there is a case were in-plane variation in the surface temperature of the wafer occurs. Therefore, there is known a technique for cooling the focus ring in order to suppress a rise in the surface temperature of the focus ring.

For example, Patent Literature No. 1 discloses an electrostatic chuck device provided with second electrostatic attraction means for attracting a focus ring to an outer peripheral portion of a wafer. In the electrostatic chuck device disclosed in Patent Literature No. 1, the focus ring is attracted to an electrostatic chuck portion with a force larger than the force of attracting the wafer, and a cooling medium (cooling gas) is sprayed on the back surface of the focus ring to adjust the temperature of the focus ring.

Further, for example, Patent Literature No. 2 discloses an electrostatic chuck device provided with a gas supply unit that supplies a heat transfer gas to each of a wafer attraction portion attracted by an electrostatic chuck portion and a focus ring. In the electrostatic chuck device disclosed in Patent Literature No. 2, the temperatures of the wafer attraction portion and the focus ring can be independently controlled.

CITATION LIST

Patent Literature

[Patent Literature No. 1] Japanese Laid-open Patent Publication No. 2002-033376

[Patent Literature No. 2] Japanese Laid-open Patent Publication No. 2012-134375

SUMMARY OF INVENTION

Technical Problem

In recent years, with an increase in output of plasma etching apparatuses, the thermal energy of plasma applied to a wafer has increased, and the surface temperature of the focus ring has become higher. On the other hand, there is a case where a method of cooling a focus ring by increasing the pressure of a cooling gas is adopted. However, in the electrostatic chuck devices of the related art, as disclosed in Patent Literature No. 1 and Patent Literature No. 2, there is a case where the surface temperature of the focus ring cannot be sufficiently controlled. The electrostatic chuck device has been required to be further improved.

The present invention has been made in view of the above circumstances, and provides an electrostatic chuck device and a method of manufacturing the electrostatic chuck device, in which it is possible to make the surface temperature of a plate-shaped sample uniform.

Solution to Problem

As a result of intensive studies conducted by the inventors of the present invention in order to solve the above problems, as one of the factors that make it impossible to sufficiently control the surface temperature of the focus ring, leakage of a cooling gas was found. It was also found that if the pressure of the cooling gas increases, the leak amount of the cooling gas increases. Therefore, the inventors have found that according to the electrostatic chuck device of the following aspect, the leakage of the cooling gas can be reduced, and have completed the present invention.

According to a first aspect of the present invention, there is provided an electrostatic chuck device including: amounting table provided with a mounting surface on which a plate-shaped sample is mounted; a focus ring having an annular shape; and a cooling element configured to cool the focus ring, in which the mounting table has a holding portion provided to surround the mounting surface, the holding portion is provided with an annular groove portion surrounding the mounting surface, and a through-hole that is open on a bottom surface of the groove portion, upper surfaces of the holding portion, which are located on both sides of the groove portion in a width direction, form a holding surface that comes into contact with the focus ring and holds the focus ring, the holding surface is composed of an inner peripheral surface which is located further on an inner periphery side than the groove portion, and an outer peripheral surface which is located further on an outer periphery side than the groove portion, and the holding surface satisfies the following conditions (i) and (ii).

(i) The holding surface has a shape in which in a cross section in a thickness direction of the holding portion, a straight line connecting a first point corresponding to an innermost periphery of the holding surface and a second point corresponding to an outermost periphery of the holding surface has a positive inclination or a negative inclination from the first point corresponding to the innermost periphery toward the second point corresponding to the outermost periphery, and the holding surface satisfies 0≤|I| in the cross section of the holding surface in the thickness direction, a height of the first point corresponding to the innermost periphery–a height of the second point corresponding to the outermost periphery |≤10 μm.

(ii) A leak area of the inner peripheral surface and a leak area of the outer peripheral surface are less than 0.7 mm².

In the electrostatic chuck device according to the first aspect of the present invention, the holding surface may satisfy the following condition (iii).

(iii) (in the cross section of the holding surface in the thickness direction, a shortest distance between the second point corresponding to the outermost periphery and a least squares straight line that is obtained from the inner peripheral surface and the outer peripheral surface) <4 μm.

In the electrostatic chuck device according to the first aspect of the present invention, a plurality of protrusion portions extending in the thickness direction of the holding portion may be provided on a bottom surface of the groove portion, and in the cross section of the holding surface in the thickness direction, a height of an upper surface of the protrusion portion may be equal to or less than a height of the straight line connecting the first point corresponding to the innermost periphery and the second point corresponding to the outermost periphery when a horizontal reference plane is used as a reference.

According to a second aspect of the present invention, there is provided a method of manufacturing the electrostatic chuck device according to the first aspect, including: a grinding step of grinding, with respect to a provisional mounting table having a sintered body provided with a mounting surface on which a plate-shaped sample is mounted and having a through-hole provided around the mounting surface, a surface of the sintered body around the mounting surface in an annular shape by using a grindstone whose length in a rotation axis direction is shorter than a length in a width direction of a holding surface from an inner peripheral surface to an outer peripheral surface, on which a focus ring is mounted; and a step of digging down the sintered body to form a groove portion surrounding the mounting surface.

More specifically, the electrostatic chuck device manufacturing method according to the second aspect includes: a step of preparing a provisional mounting table having a sintered body provided with a mounting surface on which a plate-shaped sample is mounted and having a through-holes provided around the mounting surface; a step of determining, with respect to a holding surface which mounts a focus ring thereon and is formed around the mounting surface, a length of the holding surface in a width direction, before forming the holding surface; a step of selecting a grindstone in which a length in a rotation axis direction of the grindstone is shorter than the length of the holding surface in the width direction; a grinding step of grinding a surface of the sintered body in an annular shape over a periphery of the mounting surface by using the grindstone to form a temporary holding surface that surrounds the mounting surface; and a step of digging down the temporary holding surface of the sintered body to form a groove portion surrounding the mounting surface and form a holding surface having the groove portion.

Advantageous Effects of Invention

According to an aspect of the present invention, provided are an electrostatic chuck device and a method of manufacturing the electrostatic chuck device, in which it is possible to make the surface temperature of a plate-shaped sample uniform.

DESCRIPTION OF EMBODIMENTS

Figure 1:
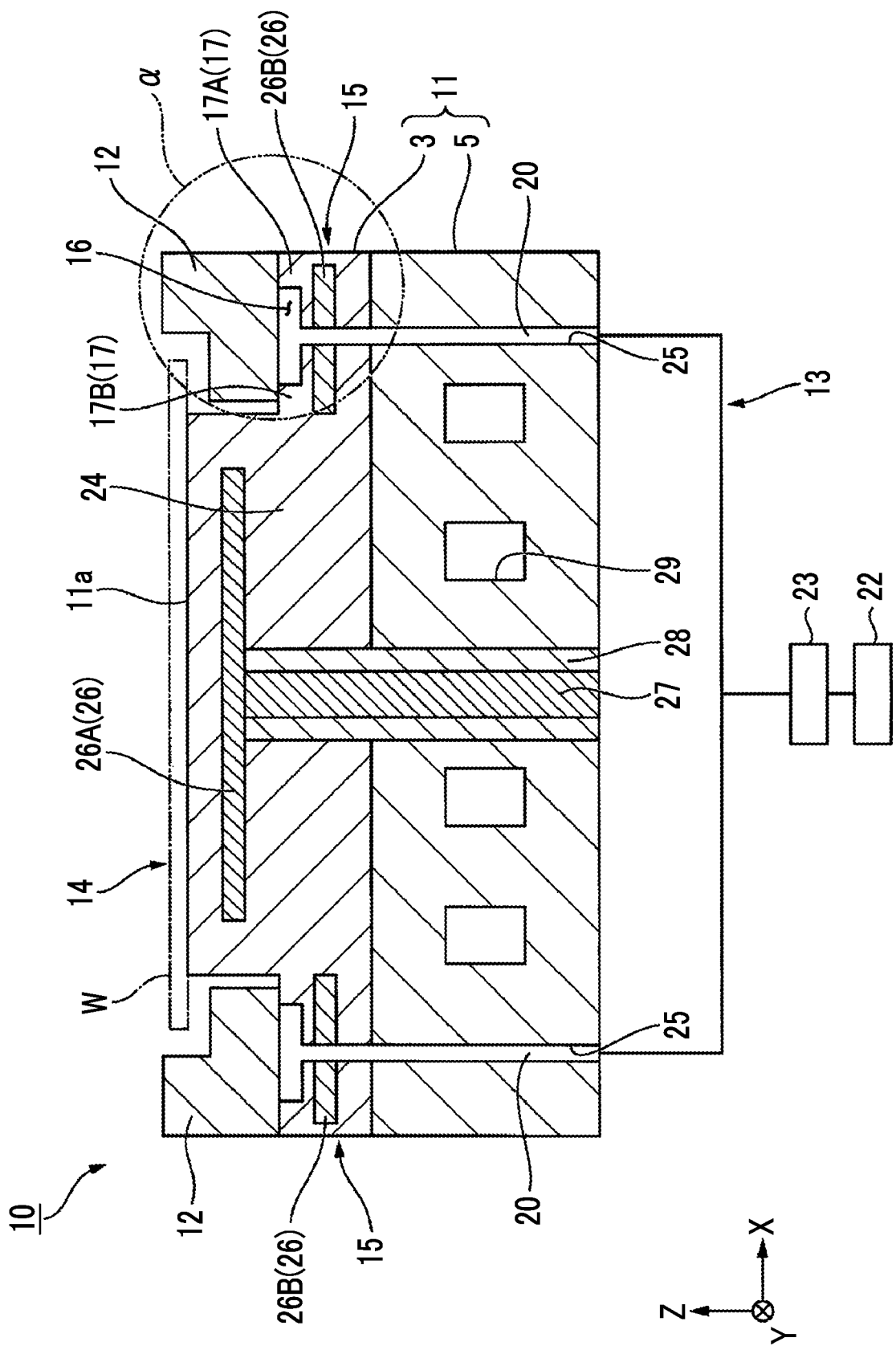
FIG. 1 is a schematic sectional view in an XZ plane showing a preferred example of an electrostatic chuck device of a first embodiment.

Hereinafter, embodiments of an electrostatic chuck device and a method of manufacturing the electrostatic chuck device according to the present invention will be described with reference to the drawings.

The present embodiment is to be specifically described in order to better understand the gist of the invention, and does not limit the present invention unless otherwise specified. Changes, omissions, or additions with respect to a number, a position, a size, a numerical value, a ratio, a shape, or the like can be made within a scope which does not deviate from the present invention.

In the drawings which are used in the following description, for the purpose of emphasizing a characteristic portion, there is a case where the characteristic portion is shown in an enlarged manner for convenience, and a dimensional ratio or the like of each constituent element may not be the same as an actual value. Further, for the same purpose, there is a case where non-characteristic portions are omitted in the drawings.

(1) First Embodiment

<Electrostatic Chuck Device>

Figure 2:
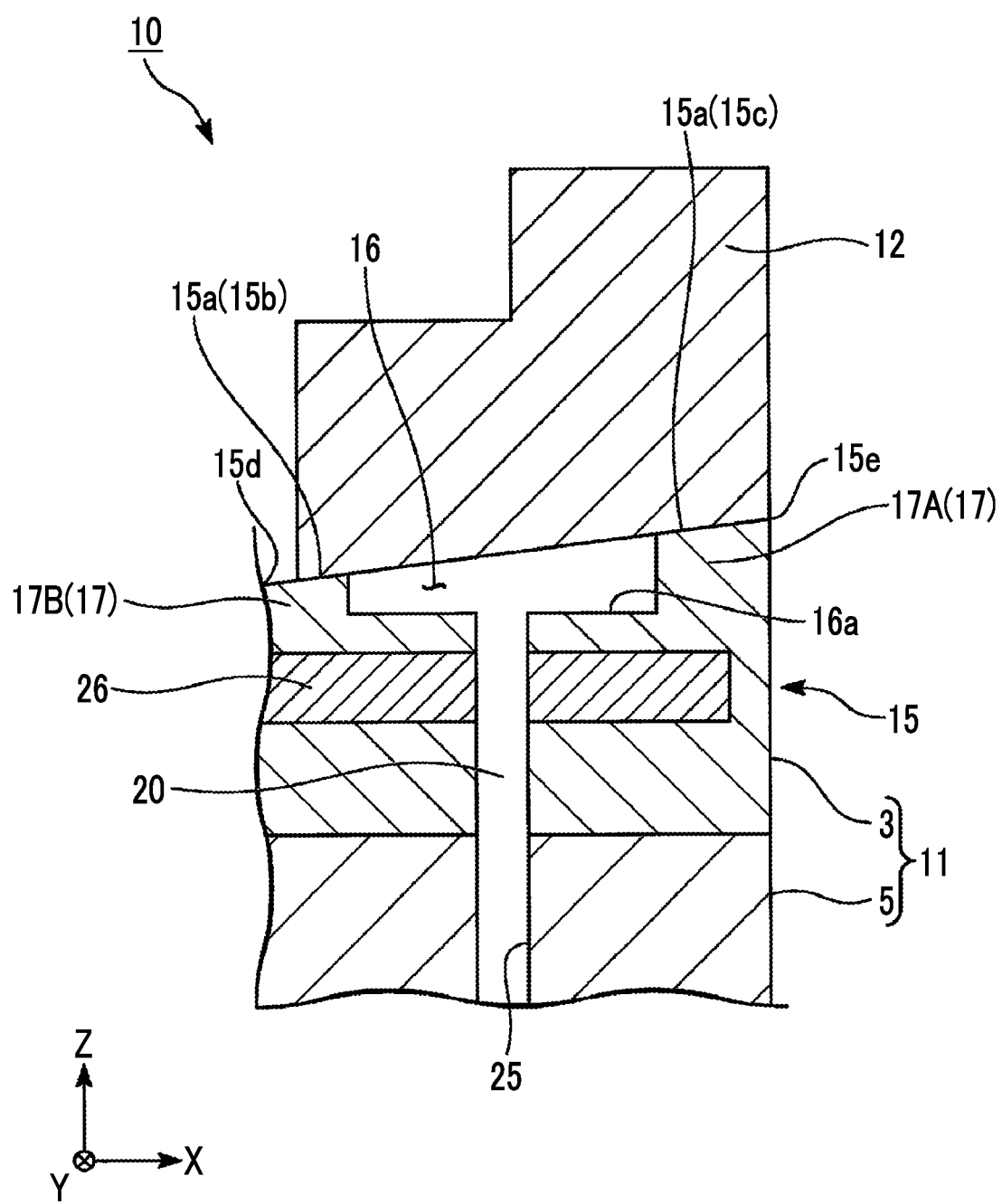
FIG. 2 is a schematic partial enlarged view in which an area indicated by α in FIG. 1 is enlarged.

FIG. 1 is a schematic sectional view in an XZ plane preferably showing an electrostatic chuck device of this embodiment. FIG. 2 is a partial enlarged view in which an area indicated by α in FIG. 1 is enlarged. In FIG. 2, the angle of a slope is shown to be increased for ease of description.

An electrostatic chuck device 10 shown in FIG. 1 includes a mounting table 11, a focus ring 12, and a cooling element 13.

In the following description, an XYZ coordinate system is set, and the positional relationship of each member will be described with reference to the XYZ coordinate system. At this time, the thickness direction of the mounting table 11 is defined as a Z-axis direction, one direction orthogonal to the Z-axis direction is defined as an X-axis direction (a right-left direction in FIG. 1), and the direction orthogonal to the Z-axis direction and the X-axis direction is defined as a Y-axis direction. In this embodiment, the Z-axis direction is a vertical direction.

[Mounting Table]

The mounting table 11 shown in FIG. 1 is provided with a mounting surface 11a on which a plate-shaped sample W such as a semiconductor wafer is mounted. The mounting table 11 includes an attraction member 3 and a cooling base 5.

[Attraction Member]

The attraction member 3 includes a dielectric substrate 24 and an electrode layer 26.

The dielectric substrate 24 shown in FIG. 1 has a shape having a protrusion portion as a whole, and in other words, a central portion protrudes and end portions are made low. That is, the mounting surface 11a is made relatively higher than a holding surface 15a. There is one step between the mounting surface 11a and the holding surface 15a due to the height difference between these surfaces.

The material for forming the dielectric substrate 24 is preferably ceramics having heat resistance. Such ceramics can be optionally selected, and for example, a sintered body of aluminum nitride (AlN), aluminum oxide (alumina, $Al_2O_3$), silicon nitride ($Si_3N_4$), zirconium oxide ($ZrO_2$), yttrium oxide ($Y_2O_3$), sialon, boron nitride (BN), or silicon carbide (SiC) can be preferably given.

Above all, the material for forming the dielectric substrate 24 is preferably a compound material of silicon carbide and aluminum oxide. If this compound material is used, the dielectric constant of the dielectric substrate 24 can be increased, and the electrostatic attraction of the plate-shaped sample W tends to become good. Further, the risk of impurities with respect to the plate-shaped sample W can be suppressed to a low level.

As the material for forming the dielectric substrate 24, one type may be used alone, or two or more types may be used in combination.

The average crystal grain size of the material for forming the dielectric substrate 24 is not particularly limited. However, for example, it is preferably 10 μm or less, more preferably 6 μm or less, and further preferably 2 μm or less. If the average crystal grain size of the material for forming the dielectric substrate 24 is 10 μm or less, chipping or shedding during processing is small, and a groove portion 16 (described later) tends to be easily formed.

The electrode layer 26 is preferably embedded in the interior of the dielectric substrate 24.

At an operating temperature of the electrostatic chuck device 10, the volume resistivity value of the electrode layer 26 is preferably $1.0 \times 10^6$ Ω·cm or less, and more preferably $1.0 \times 10^4$ Ω·cm or less.

The material for forming the electrode layer 26 is preferably conductive ceramics. As the conductive ceramics, although it can be optionally selected, a composite sintered body of silicon carbide (SiC) and aluminum oxide ($Al_2O_3$), a composite sintered body of tantalum nitride (TaN) and aluminum oxide ($Al_2O_3$), a composite sintered body of tantalum carbide (TaC) and aluminum oxide ($Al_2O_3$), a composite sintered body of molybdenum carbide ($Mo_2C$) and aluminum oxide ($Al_2O_3$), or the like can be preferably given as an example.

The thickness of the electrode layer 26 can be optionally selected. However, it may be in a range of 10 μm to 50 μm, for example. The thickness may be in a range of 20 μm to 40 μm.

The attraction member 3 has an electrostatic chuck portion 14 and a holding portion 15. The electrostatic chuck portion 14 is preferably located at the center of the attraction member when viewed in a plan view. The electrode layer 26 described above is disposed in each of the electrostatic chuck portion 14 and the holding portion 15.

In this embodiment, there is a case where the electrode layer disposed in the electrostatic chuck portion 14 of the attraction member 3 is referred to as an "electrode layer 26A". Further, there is a case where the electrode layer disposed in the holding portion 15 of the attraction member 3 is referred to as an "electrode layer 26B". When being simply referred to as an "electrode layer 26", it refers to both the electrode layer 26A and the electrode layer 26B.

The electrode layer 26A and the electrode layer 26B may be electrically connected to each other and may not be electrically connected to each other. In this case, power may be supplied by different power supply terminals.

The upper surface (mounting surface) of the electrostatic chuck portion 14 of the dielectric substrate 24 is located at a position higher than the upper surface (holding surface) of the holding portion 15 of the dielectric substrate 24.

(Electrostatic Chuck Portion)

A power supply terminal 27 that energizes the electrode layer 26 is disposed in the electrostatic chuck portion 14. By energizing the electrode layer 26 from the power supply terminal 27, the electrostatic chuck portion 14 of the dielectric substrate 24 can exhibit an electrostatic attraction force. One end of the power supply terminal 27 is connected to the lower surface of the electrode layer 26A. On the other hand, the other end of the power supply terminal 27 is electrically connected to an external power source (not shown).

The periphery of the power supply terminal 27 is covered with an insulator 28. The insulator 28 shown in FIG. 1 is a cylindrical housing. The insulator 28 has a space which accommodates the power supply terminal 27 therein. In this way, the power supply terminal 27 is insulated from the outside of the insulator 28.

The upper surface (the surface on the +Z side, that is, the surface on the side far from the attraction member) of the electrostatic chuck portion 14 of the dielectric substrate 24 is the mounting surface 11a described above.

(Holding Portion)

The holding portion 15 in the electrostatic chuck device 10 of this embodiment is formed in an annular shape when viewed in a plan view so as to surround the mounting surface 11a.

The holding portion 15 is preferably provided with a groove portion 16 and a plurality of through-holes 25. The through-hole is preferably disposed in the groove portion 16.

The groove portion 16 is formed in an annular shape when viewed in a plan view so as to surround the mounting surface 11a. A cooling gas is diffused in the groove portions 16. In this way, a focus ring is cooled from the portion which comes into contact with the cooling gas.

In the holding portion 15, upper surfaces of two portions located on both sides of the groove portion 16 in the width direction are the holding surfaces 15a that are in contact with a focus ring 12 and hold the focus ring 12. The holding surface 15a restrains the cooling gas flowing in the groove portion 16 from leaking to the outside. The holding surface 15a is composed of an inner peripheral surface 15b further on the inner periphery side than the groove portion 16 and an outer peripheral surface 15c further on the outer periphery side than the groove portion 16.

In this embodiment, there is a case where a continuous band-shaped structure having the holding surface 15a is referred to as a seal band 17. The seal band 17 includes a seal band 17A that holds the focus ring on the outer side, and a seal band 17B that holds the focus ring further on the inner side than the seal band 17A. The seal band 17 is in contact with the focus ring 12 at the holding surface 15a to seal the cooling gas flowing in the groove portion 16 so as not to leak to the outside. Each of the seal bands 17A and 17B has a ring shape (doughnut shape) when viewed in a plan view.

The plurality of through-holes 25 are open on a bottom surface 16a of the groove portion 16.

The holding portion 15 in the electrostatic chuck device 10 of this embodiment is formed by performing grinding (described later) on a raw material of the dielectric substrate 24.

[Cooling Base]

The cooling base 5 in the electrostatic chuck device 10 of this embodiment is provided in contact with the lower surface of the attraction member 3. The attraction member 3 and the cooling base 5 can be bonded to each other by any method or material. They may be bonded to each other by an adhesive such as silicone-based adhesive, for example. The cooling base 5 shown in FIG. 1 has a disk shape. The cooling base 5 is provided with a plurality of flow paths 29.

The flow path 29 is a flow path for circulating a cooling medium such as water or an organic solvent. Due to this flow path, the heat of the attraction member 3 can be released to the cooling base 5, and thus the attraction member 3 can be cooled. As a result, the plate-shaped sample W mounted on the mounting surface 11a is cooled, and thus the temperature of the plate-shaped sample W can be kept low.

The material for forming the cooling base 5 can be optionally selected, and it is not particularly limited as long as it is metal having excellent thermal conductivity, electrical conductivity, and workability, or a compound material containing the metal. For example, aluminum (Al), an aluminum alloy, copper (Cu), a copper alloy, stainless steel (SUS), titanium (Ti), or the like can be preferably used.

[Focus Ring]

The focus ring 12 is preferably controlled to have substantially the same temperature as that of the plate-shaped sample W in a processing process such as plasma etching in a semiconductor manufacturing process.

The focus ring 12 in the electrostatic chuck device 10 of this embodiment is disposed in an annular shape on the mounting table 11 so as to surround the mounting surface 11a. The focus ring 12 in the electrostatic chuck device 10 of this embodiment is disposed such that the entirety thereof planarly overlaps the holding portion 15 when viewed in a plan view, and is held by the holding portion 15. The inner diameter of the focus ring 12 is larger than the diameter of the electrostatic chuck portion 14 of the attraction member 3.

In this embodiment, the focus ring 12 is provided along the circumferential direction of the holding portion 15 described above. Further, the focus ring 12 is provided along the circumferential direction of the groove portion 16 described above.

Since the focus ring 12 is easily electrostatically attracted to the mounting table 11, it is preferable that the volume resistivity of the material for forming the focus ring 12 is low. Further, since the temperature of the focus ring 12 can be easily controlled, it is preferable that the thermal conductivity of the material for forming the focus ring 12 is high. As the material for forming the focus ring 12 having such characteristics, it can be optionally selected. However, ceramics can be given as an example. As the material, polycrystalline silicon, silicon carbide, or the like can be preferably given. For example, in a case where the electrostatic chuck device 10 is used for oxide film etching, polycrystalline silicon, silicon carbide, or the like is suitably used for the material for forming the focus ring 12.

[Cooling Element]

The cooling element 13 in the electrostatic chuck device 10 of this embodiment has a structure for feeding a cooling gas into the plurality of through-holes 25. The inside of each of the plurality of through-holes 25 serves as a gas flow path 20.

The plurality of gas flow paths 20 are for supplying a cooling gas to the groove portion 16. The cooling gas which is used in this embodiment can be optionally selected. However, a helium (He) gas can be preferably given as an example.

A cooling gas supply source 22 for supplying the cooling gas is connected to the plurality of gas flow paths 20 through a pressure control valve 23. The pressure control valve 23 is a valve for adjusting a flow rate such that the pressure of the cooling gas reaches a predetermined pressure. The number of the gas flow paths 20 for supplying the cooling gas from the cooling gas supply source 22 may be one or a plurality.

The cooling element 13 supplies the cooling gas to the groove portion 16 through the plurality of gas flow paths 20. In this way, the cooling element 13 can cool the focus ring 12.

(Configuration of Holding Portion)

As a result of studies by the inventors of the present invention, it was founded that there is a case where due to grinding, a height difference between the inner periphery and the outer periphery, a ducktail (shape with a rear end raised like a duck's butt) which is generated at the outermost periphery, or a local recess is formed on the surface of the holding portion 15.

In particular, it is presumed that the height difference between the inner periphery and the outer periphery which are formed on the holding surface 15a, the ducktail which is generated at the outermost periphery, and the local recess cause leakage of the cooling gas. Therefore, in the electrostatic chuck device 10 of this embodiment, it is required that the height difference between the inner periphery and the outer periphery of the holding surface 15a, the ducktail which is generated at the outermost periphery, and the local recess are controlled so as not to be included as much as possible.

The holding surface 15a in the electrostatic chuck device 10 of this embodiment has a shape in which in the cross section in the thickness direction, a straight line connecting a first point corresponding to an innermost periphery 15d of the holding surface 15a and a second point corresponding to an outermost periphery 15e of the holding surface 15a has a positive inclination from the first point corresponding to the innermost periphery 15d of the holding surface 15a toward the second point corresponding to the outermost periphery 15e of the holding surface 15a (a shape that rises from the first point corresponding to the innermost periphery 15d of the holding surface 15a toward the second point corresponding to the outermost periphery 15e of the holding surface 15a). Further, an expression which is expressed by $0 \leq |$ in the cross section of the holding surface 15a in the thickness direction, the height of the first point corresponding to the innermost periphery 15d of the holding surface 15a–the height of the second point corresponding to the outermost periphery 15e of the holding surface 15a|≤10 μm (hereinafter, sometimes referred to as a first expression) is also satisfied (condition (i)). In the above expression, an absolute value is used. That is, in FIG. 2, the holding surface 15a has a shape in which in the cross section in the thickness direction, the straight line connecting the first point corresponding to the innermost periphery 15d of the holding surface 15a and the second point corresponding to the outermost periphery 15e of the holding surface 15a has a positive inclination from the first point toward the second point. Further, at the same time, a value which is obtained from an expression which is expressed by (the height of the second point corresponding to the outermost periphery 15e of the holding surface 15a–the height of the first point corresponding to the innermost periphery 15d of the holding surface 15a) (hereinafter, sometimes referred to as a second expression) is 0 μm or more and 10 μm or less. Hereinafter, this is sometimes referred to as a condition (i-i). The value which is obtained from the second expression is preferably 0 μm or more and 9 μm or less. If necessary, the above value may be larger than 0 μm and 10 μm or less, 0.1 μm or more and 9.0 μm or less, 0.5 μm or more and 8.5 μm or less, 1.0 μm or more and 8.0 μm or less, 2.0 μm or more and 6.0 μm or less, or 3.0 μm or more and 5.0 μm or less. If the value which is obtained from the second expression exceeds 10 μm, it becomes difficult for the focus ring 12 electrostatically attracted to the holding surface 15a of the holding portion 15 to follow the height difference of the holding surface 15a. If it becomes difficult for the focus ring 12 to follow the height difference of the holding surface 15a, a gap at the seal band 17 of the holding portion 15 becomes large. As a result, the leak amount of the cooling gas from the gap increases.

In the electrostatic chuck device 10 of this embodiment, the cross section of the holding surface 15a in the thickness direction is a cross section which passes through the center of an annulus of the holding surface 15a having an annular shape.

In the cross section of the holding surface 15a in the thickness direction, the height of the first point corresponding to the innermost periphery 15d of the holding surface 15a and the height of the second point corresponding to the outermost periphery 15e of the holding surface 15a are heights in the thickness direction of the holding portion 15 with any horizontal reference plane (any horizontal reference plane corresponds to, for example, a platen surface on which an electrostatic chuck device is mounted in a three-dimensional measuring machine. The horizontal reference plane only needs to be a plane parallel to the XY plane, and may use a flat bottom surface which is located opposite to the mounting surface of the attraction member 3 as a reference plane) as a reference.

The height difference in the electrostatic chuck device 10 of this embodiment can be measured using a three-dimensional measuring machine (trade name: Zyzax SVA NEX, manufactured by Tokyo Seimitsu Co., Ltd.) in accordance with JIS B 6191. In this measurement, first, with respect to the three-dimensional coordinates of the upper surfaces (holding surfaces) 15a of the outer seal band 17A and the inner seal band 17B in the width direction of the groove portion 16, any point within 1 mm from the innermost periphery 15d of the holding surface 15a to the outer periphery side (referred to as point a), and any point within 1 mm from the outermost periphery 15e of the holding surface 15a to the inner periphery side (referred to as point d) are measured. Further, 180 points are likewise measured every 2° on the concentric circumference.

In the electrostatic chuck device 10 of this embodiment, for the height difference, in the cross section of the holding surface 15a in the thickness direction, the difference between the height of the second point corresponding to the outermost periphery 15e of the holding surface 15a and the height of the first point corresponding to the innermost periphery 15d of the holding surface 15a is calculated at 180 points, and the maximum value of the measured values is adopted. The point a corresponds to the first point, and the point d corresponds to the second point.

The holding surface 15a has a shape in which in the cross section in the thickness direction, the straight line connecting the first point corresponding to the innermost periphery 15d of the holding surface 15a and the second point corresponding to the outermost periphery 15e of the holding surface 15a always has a positive inclination from the first point toward the second point. That is, the holding surface 15a does not have a portion (protrusion portion) protruding toward the focus ring 12 side or a portion (recess) recessed toward the cooling base 5 side, in the middle of the straight line connecting the first point and the second point in the cross section in the thickness direction.

In the holding surface 15a in the electrostatic chuck device 10 of this embodiment, the leak area of the inner peripheral surface 15b and the leak area of the outer peripheral surface 15c are less than 0.7 mm$^2$. Hereinafter, this is sometimes referred to as a condition (ii). The leak area of the inner peripheral surface 15b and the leak area of the outer peripheral surface 15c are preferably 0.6 mm$^2$ or less, and more preferably 0.5 mm$^2$ or less. The lower limit of the leak area can be optionally selected as necessary. However, it may be, for example, 0.00 mm$^2$ or 0.01 mm$^2$ or more, or may be 0.05 mm$^2$ or more, or 0.1 mm$^2$ or more.

When the leak area of the inner peripheral surface 15b and the leak area of the outer peripheral surface 15c are 0.7 mm$^2$ or more, the area of the local recess where the focus ring 12 electrostatically attracted to the holding surface 15a of the holding portion 15 cannot follow the holding surface 15a becomes large. If the area of the local recess where the focus ring 12 cannot follow the holding surface 15a becomes large, the gap at the seal band 17 of the holding portion 15 becomes large, and thus the leak amount of the cooling gas from the gap increases.

In the electrostatic chuck device 10 of this embodiment, the holding surface 15a of the holding portion 15 tends to have a continuous concavo-convex structure having a large cycle (swell having a large cycle, in other words, gentle mountains and valleys) caused by grinding due to the influence of the flow path 29 of the cooling base provided at the mounting table 11. With respect to a large swell, the focus ring 12 follows it due to an electrostatic attraction force.

In this embodiment, the cycle of the large swell which is formed on the holding surface 15a is preferably 60 degrees or more. It is considered that the focus ring 12 can sufficiently follow the unevenness of the holding surface 15a when the cycle of the swell is 60 degrees or more. When the cycle of the swell is 60 degrees or more, the number of peaks and the number of bottoms of the swell may be 6 or less, respectively.

In this embodiment, for the evaluation of the surface of the holding surface, the sum of sine curves having any number of peak bottoms (mountains and valleys) in the circumferential direction of the angle is calculated. The calculation result is compared with, that is, fitted to the actually measured data of the shape (dimensions) of the holding surface 15a of the holding portion 15 (three-dimensional data of the center of the inner peripheral surface 15b and the center of the outer peripheral surface 15c). The difference between the actually measured data of the shape (dimensions) of the holding surface 15a of the holding portion 15 and a fitting curve is assumed to be a "shape that the focus ring 12 cannot follow", and the difference is defined as a leak area.

(Example of How to Obtain Leak Area)

An example of how to obtain the leak area is described below.

The surface shape (dimensions) of the holding surface 15a of the holding portion 15 is measured in the circumferential direction of the angle (the circumferential direction of a circle using the center of the mounting table 11 on the holding surface 15a as an axis). Specifically, the three-dimensional data of the center of the inner peripheral surface 15b and the center of the outer peripheral surface 15c is actually measured and this is defined as a fitting line 1. For example, in the actual measurement, the center of each surface is measured at 180 points, and the line 1 may be formed from the measured values.

On the other hand, curve fitting is performed by the least squares method by using a plurality of sine curves (sine waves) having any number of different cycles (the number of cycles: T) (a fitting line 2 is obtained). The calculated curve having a concavo-convex shape (for example, the horizontal axis is an angle (0 to 360 degrees) and the vertical axis is a height) indicates the shape of a large swell that the focus ring can follow, and is used as a comparison. The closer the fitting line 1 is to the fitting curve 2, the more the focus ring can follow the swell of the holding surface, and this is means that the leak area is small. As the fitting line 2, a fitting line having the smallest distance from the fitting line 1 obtained from the actually measured data can be selected. As described below, the fitting line 2 is in contact with the fitting line 1 at one or more points, and is always disposed above the fitting line 1.

Next, the leak area is obtained. The curve fitting line 2 is preferably arranged in the same graph such that it is always located above the curve fitting line 1 and the area between the two lines is minimized. The area between the two lines can be defined as the leak area.

As described above, the difference between the actually measured data of the shape (dimensions) of the holding surface 15a of the holding portion 15 and the data which is indicated by the fitting curve 2 is assumed as a "shape (dimensions) that the focus ring 12 cannot follow", and the difference can be defined as the leak area.

The fitting curve 2 only needs to be a shape that the focus ring 12 can follow. As an example, a curve "fitted by the least squares method by using a sine curve having one cycle (T=1, one peak and one bottom) at 360 degrees in the data in which the horizontal axis shows an angle and the vertical axis shows a height, a sine curve having two cycles (T=2, two peaks and two bottoms), and a sine curve having three cycles (T=3, three peaks and three bottoms)" can be preferably given.

As described above, the holding surface 15a satisfies the conditions (i-i) and (ii), whereby it is possible to reduce the gap between the holding surface 15a of the holding portion 15 and the focus ring 12. In this way, it is possible to reduce the amount of the cooling gas leaking from the gap. As a result, in this embodiment, it becomes easy to control the pressure of the cooling gas. Therefore, in the electrostatic chuck device 10, the temperature of the focus ring 12 can be easily controlled, and it is possible to make the surface temperature of the plate-shaped sample W uniform.

Figure 3:
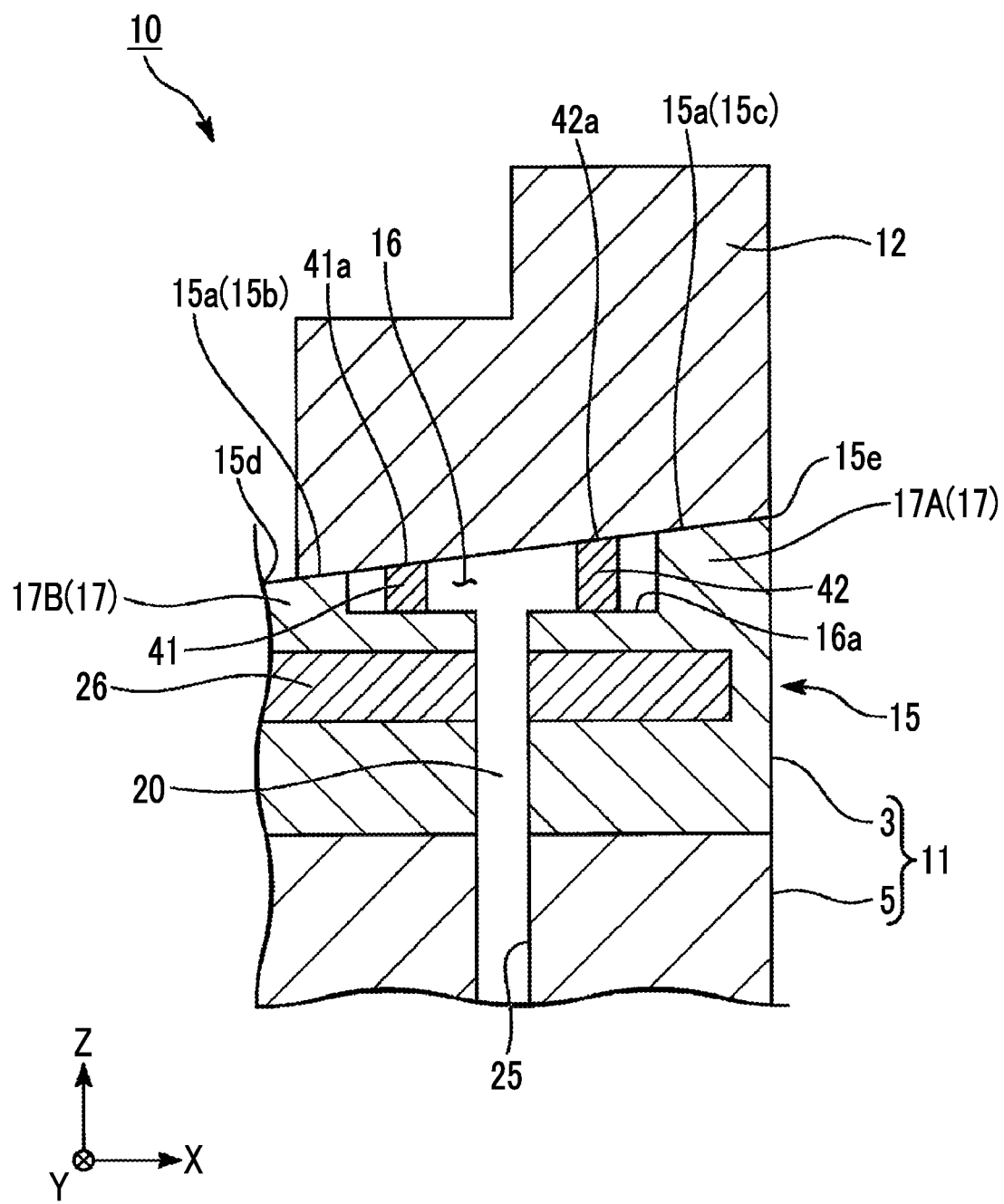
FIG. 3 is a schematic partial enlarged view in which the area indicated by α in FIG. 1 is enlarged.

Further, in the electrostatic chuck device 10 of this embodiment, as shown in FIG. 3, it is also preferable that columnar protrusion portions 41 and 42 extending in the thickness direction of the holding portion 15 are provided on the bottom surface 16a of the groove portion 16. It is preferable that in the cross section of the holding surface 15a in the thickness direction, the heights to upper surfaces 41a and 42a of the protrusion portions 41 and 42 with any horizontal reference plane (any horizontal reference plane corresponds to, for example, a platen surface on which an electrostatic chuck device is mounted in a three-dimensional measuring machine) as a reference are equal to or less than the height (distance from the reference plane) of the straight line connecting the first point corresponding to the innermost periphery 15d of the holding surface 15a and the second point corresponding to the outermost periphery 15e of the holding surface 15a with the any horizontal reference plane as a reference. The protrusion portions 41 and 42 are preferably formed of the same material as the dielectric substrate 24. The protrusion portion 41 is provided on the inner periphery side of the bottom surface 16a of the groove portion 16, and the protrusion portion 42 is provided on the outer periphery side of the bottom surface 16a of the groove portion 16. With such a structure, in a case where the focus ring 12 is electrostatically attracted to the holding surface 15a of the holding portion 15 without obstructing the flow of the cooling gas, the protrusion portions 41 and 42 come into contact with the focus ring 12, and the contact area between the holding portion 15 and the focus ring 12 increases. As a result, the electrostatic attraction between the holding surface 15a of the holding portion 15 and the focus ring 12 can be improved, and the gap between the holding surface 15a of the holding portion 15 and the focus ring 12 can be reduced. As a result, the leak of the cooling gas can be suppressed, the cooling efficiency can be improved, and the surface temperature of the focus ring 12 (eventually the plate-shaped sample W) can be uniformly controlled by optimizing the outer diameters or disposition of the protrusion portions 41 and 42. The shape of each of the protrusion portions 41 and 42 when viewed in a plan view can be optionally selected. For example, each of the protrusion portions may have one continuous annular shape, or may have a plurality of circles, quadrangles, or other shapes.

In FIG. 3, a case where the two protrusion portions 41 and 42 are provided on the bottom surface 16a of the groove portion 16 is illustrated. The electrostatic chuck device 10 of this embodiment is not limited to this. In the electrostatic chuck device 10 of this embodiment, one or more protrusion portions may be provided only on the inner periphery side or the outer periphery side of the groove portion 16, and one or more protrusion portions may be provided on each of the inner periphery side and the outer periphery side of the groove portion 16. Further, an interval at which the protrusion portions are provided is not particularly limited.

According to the configuration described above, an electrostatic chuck device can be provided in which it is possible to make the surface temperature of the plate-shaped sample uniform.

<Electrostatic Chuck Device Manufacturing Method>

A preferred example of a manufacturing method for obtaining the electrostatic chuck device 10 described above will be described with reference to FIGS. 4 and 5.

The method of manufacturing the electrostatic chuck device of this embodiment includes a grinding step, and a step of forming the groove portion 16. As steps other than the grinding step and the step of forming the groove portion 16, steps which are performed in known electrostatic chuck device manufacturing methods can be performed.

Figure 4:
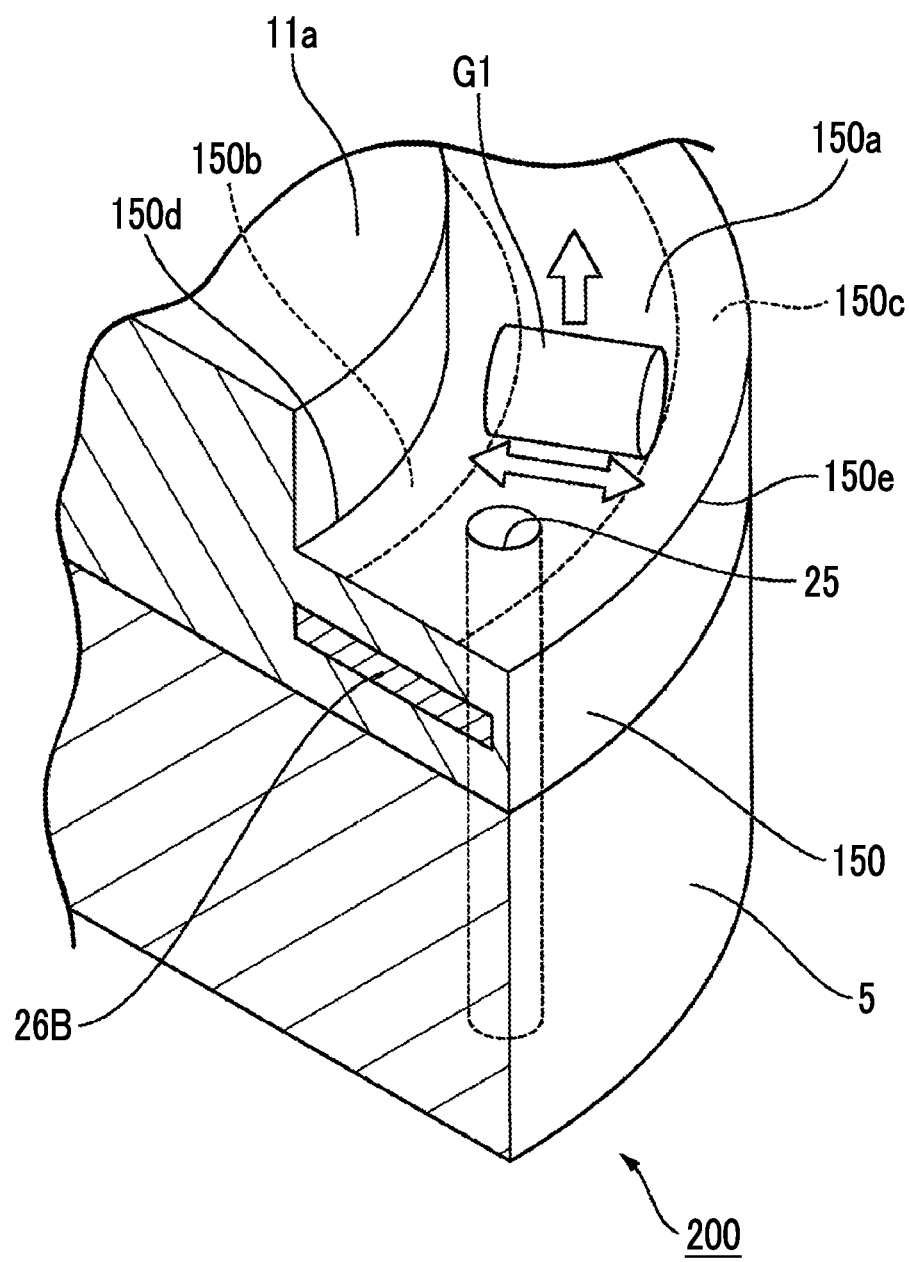
FIG. 4 is a schematic perspective view describing a grinding step in an example of a preferred method of manufacturing the electrostatic chuck device of the first embodiment.

FIG. 4 is a perspective view showing a preferred example of the grinding step in the method of manufacturing the electrostatic chuck device of this embodiment. In the grinding step of this embodiment, a provisional mounting table 200 is ground while rotating a cylindrical grindstone G1.

The provisional mounting table 200 has a sintered body 150, the plurality of through-holes 25, and the cooling base 5. The sintered body 150 is provided with the mounting surface 11a (refer to FIG. 1) on which the plate-shaped sample W is mounted, and the through-holes 25 are provided around the mounting surface 11a. Further, the sintered body 150 is provided with the electrode layer 26B. In the provisional mounting table 200, the sintered body 150 and the cooling base 5 are bonded to each other by an adhesive (not shown) such as a silicone-based adhesive. FIG. 4 shows a state where grinding has already proceeded to some extent by rotating the cylindrical grindstone G1.

In the grinding step in the method of manufacturing the electrostatic chuck device of this embodiment, for example, a rotary grinder or the like can be used.

As the cylindrical grindstone G1, a grindstone whose length in a rotation axis direction is shorter than the length in the width direction of the holding surface 15a from the inner peripheral surface 15b to the outer peripheral surface 15c, on which the focus ring 12 is mounted, is used.

The width (length in the width direction) of the grindstone can be optionally selected as necessary. However, for example, it may be in a range of 10 to 98%, preferably in a range of 20 to 90% with respect to the length of the holding surface in the width direction, and it may be in a range of 20 to 70%. The width is not limited to these, and it may be in a range of 10 to 60%, a range of 20 to 40%, a range of 30 to 50%, or the like.

The peripheral velocity of the grindstone can also be optionally selected. For example, a range of 10 to 200 m/s is preferable, a range of 30 to 180 m/s is more preferable, a range of 60 to 160 m/s is further preferable, and a range of 70 to 150 m/s is particularly preferable. The peripheral velocity is not limited to these, and it may be in a range of 5 to 80 m/s, a range of 20 to 110 m/s, or a range of 40 to 140 m/s.

The type or conditions of the grindstone can be optionally selected. However, for example, a material having a hardness higher than that of alumina and lower than that of diamond is preferable, and for example, silicon carbide is more preferable. In the polishing, the position of the grindstone may be moved in a radial direction, as necessary.

In the grinding step in the method of manufacturing the electrostatic chuck device of this embodiment, the provisional mounting table 200 is ground such that a surface 150a around the mounting surface 11a satisfies, for example, the following conditions (i-i) and (ii).

(i-i) In the cross section of the sintered body 150 in the thickness direction, the straight line connecting the first point corresponding to an innermost periphery 150d of the surface 150a and the second point corresponding to an outermost periphery 150e of the surface 150a has a shape having a positive inclination from the first point corresponding to the innermost periphery 150d of the surface 150a toward the second point corresponding to the outermost periphery 150e of the surface 150a (a shape that rises from the first point corresponding to the innermost periphery 150d of the surface 150a toward the second point corresponding to the outermost periphery 150e of the surface 150a), and (a height of the second point corresponding to the outermost periphery 150e of the surface 150a–a height of the first point corresponding to the innermost periphery 150d of the surface 150a) is 0 µm or more and 10 µm or less.

(ii) The leak area of an inner peripheral surface 150b of the surface 150a and the leak area of an outer peripheral surface 150c of the surface 150a are less than 0.7 mm$^2$.

Usually, when a sintered body is ground with a grindstone, grinding heat is generated. The faster the peripheral velocity of the grindstone G1, the larger the amount of heat generation becomes. If the amount of heat generation becomes large, there is a case where the attraction member 3 and the cooling base 5 are deformed due to the difference in thermal expansion between the attraction member 3 and the cooling base 5. Due to this deformation, there is a case where a height difference occurs on the surface 150a of the sintered body 150. Further, the faster the peripheral velocity of the grindstone G1, the further the productivity is improved. However, on the other hand, there is a case where a local recess is generated on the surface 150a of the sintered body 150.

The peripheral velocity of the grindstone G1 may be determined by performing a preliminary experiment. Specifically, a preliminary experiment is performed using provisional mounting tables having the same conditions, and a velocity at which the surface 150a satisfies the above conditions (i-i) and (ii) is obtained in advance, and in subsequent manufacturing, it is favorable to set the peripheral velocity and perform manufacturing. For example, in the preliminary experiment, a plurality of different peripheral velocities and a plurality of grindstones having different widths are prepared, and in each combination, manufacturing and evaluation of electrostatic chuck devices are performed, and from the obtained results, a combination thereof which shows a preferable result may be selected. By such a method, a very excellent electrostatic chuck device can be efficiently manufactured.

Figure 5:
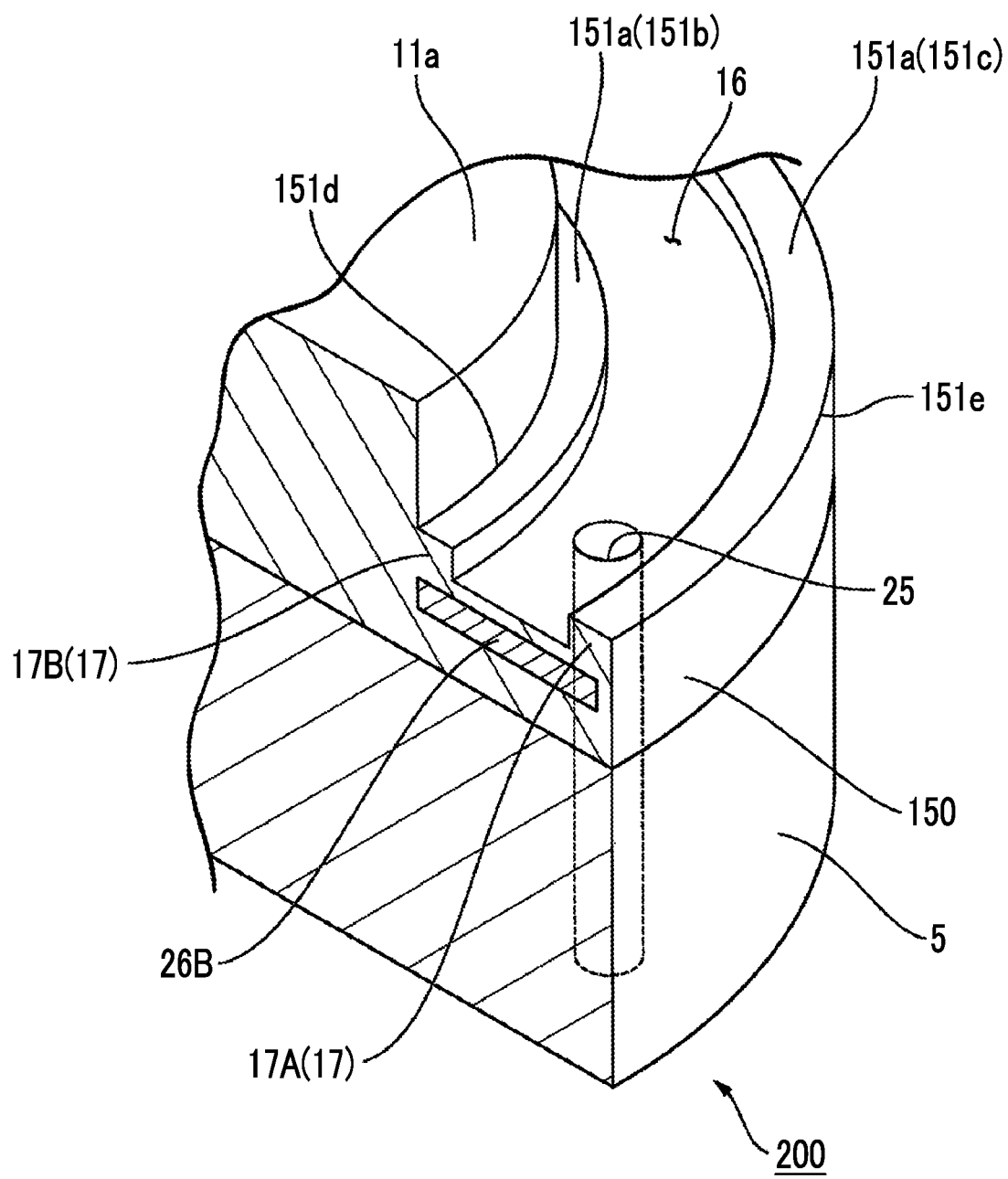
FIG. 5 is a schematic perspective view describing a step of forming a groove portion in the example of the preferred method of manufacturing the electrostatic chuck device of the first embodiment.

FIG. 5 is a schematic perspective view showing a step of forming the groove portion 16 in the method of manufacturing the electrostatic chuck device of this embodiment. In the step of forming the groove portion 16 in the method of manufacturing the electrostatic chuck device of this embodiment, the sintered body 150 is dug down by an optionally selected method to form the groove portion 16 surrounding the mounting surface 11a. In the step of forming the groove portion 16 in the method of manufacturing the electrostatic chuck device of this embodiment, for example, rotary processing, blast processing, or the like can be used, and in particular, the blast processing is suitably used.

As a medium which is used for the blast processing, it can be optionally selected. However, aluminum oxide (alumina, Al$_2$O3), silicon carbide, glass beads, or the like is preferable. The medium is preferably 400 mesh under (passes through 300 mesh). The discharge pressure of the medium in the blast processing is, for example, preferably 0.1 MPa or less, and more preferably 0.05 MPa or less.

According to the method as described above, the holding surface 15a of the obtained electrostatic chuck device 10 satisfies the above conditions (i-i) and (ii). As a result, it is possible to manufacture an electrostatic chuck device in which it is possible to make the surface temperature of the plate-shaped sample uniform.

The first embodiment of the present invention has been described above. However, the respective configurations, a combination thereof, and the like in this embodiment are examples, and addition, omission, replacement, and other changes of a configuration can be made within a scope which does not depart from the gist of the present invention. Further, the present invention is not limited by this embodiment.

Further, for example, the holding portion 15 described above may be provided with a heater (not shown).

In this way, by heating the focus ring 12, it is possible to control the temperature of the focus ring 12 to substantially the same temperature as that of the plate-shaped sample W.

(2) Second Embodiment

<Electrostatic Chuck Device>

Figure 6:
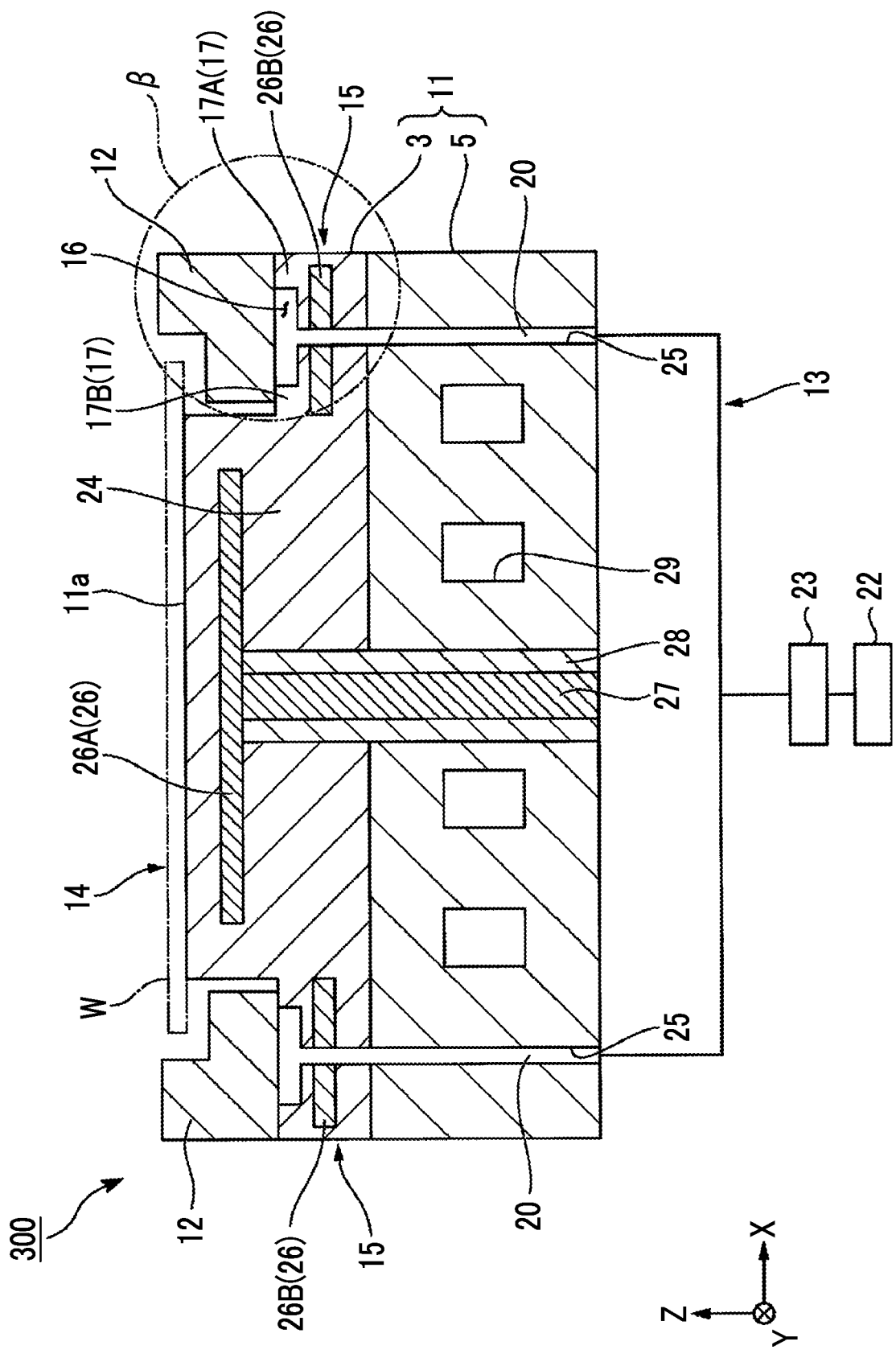
FIG. 6 is a schematic sectional view in an XZ plane showing a preferred example of an electrostatic chuck device of a second embodiment.
Figure 7:
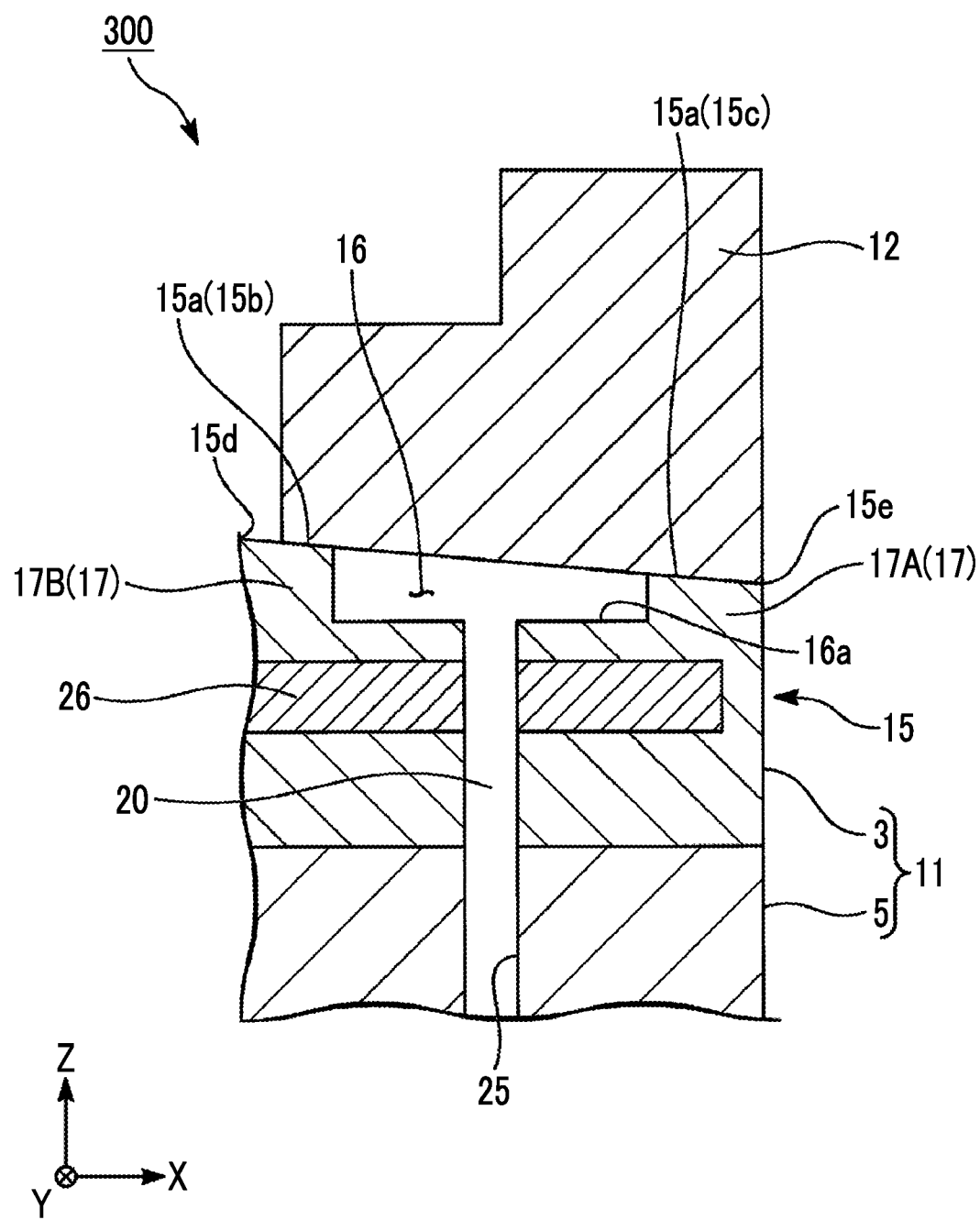
FIG. 7 is a schematic partial enlarged view in which an area indicated by β in FIG. 6 is enlarged.

FIG. 6 is a sectional view in an XZ plane showing an electrostatic chuck device of this embodiment. FIG. 7 is a partial enlarged view in which an area indicated by β in FIG. 6 is enlarged.

In FIG. 6, the same configurations as those of the electrostatic chuck device of the first embodiment shown in FIG. 1 are designated by the same reference numerals, and overlapping description is omitted. Further, in FIG. 7, the same configurations as those of the electrostatic chuck device of the first embodiment shown in FIG. 2 are designated by the same reference numerals, and overlapping description is omitted.

An electrostatic chuck device 300 shown in FIG. 6 includes the mounting table 11, the focus ring 12, and the cooling element 13.

The holding surface 15a in the electrostatic chuck device 300 of this embodiment has a shape in which in the cross section in the thickness direction, the straight line connecting the first point corresponding to the innermost periphery 15d of the holding surface 15a and the second point corresponding to the outermost periphery 15e of the holding surface 15a has a negative inclination from the first point corresponding to the innermost periphery 15d of the holding surface 15a toward the second point corresponding to the outermost periphery 15e of the holding surface 15a, and also satisfies an expression (the first expression) which is expressed by 0≤| in the cross section of the holding surface 15a in the thickness direction, the height of the first point corresponding to the innermost periphery 15d of the holding surface 15a−the height of the second point corresponding to the outermost periphery 15e of the holding surface 15a|≤10 μm (condition (i)). That is, in FIG. 7, the holding surface 15a has a shape in which in the cross section in the thickness direction, the straight line connecting the first point corresponding to the innermost periphery 15d of the holding surface 15a and the second point corresponding to the outermost periphery 15e of the holding surface 15a has a negative inclination from the first point toward the second point. Further, at the same time, a value which is obtained from an expression which is expressed by (a height of the first point corresponding to the innermost periphery 15d of the holding surface 15a−a height of the second point corresponding to the outermost periphery 15e of the holding surface 15a) (hereinafter, sometimes referred to as a third expression) is 0 μm or more and 10 μm or less. Hereinafter, this is sometimes referred to as a condition (i-ii). The value which is obtained from the third expression is preferably 0 μm or more and 9 μm or less. If necessary, the above value may be larger than 0 μm and 10 μm or less, 0.1 μm or more and 9.0 μm or less, 0.5 μm or more and 8.5 μm or less, 1.0 μm or more and 8.0 μm or less, 2.0 μm or more and 6.0 μm or less, or 3.0 μm or more and 5.0 μm or less. If the value which is obtained from the third expression exceeds 10 μm, it becomes difficult for the focus ring 12 electrostatically attracted to the holding surface 15a of the holding portion 15 to follow the height difference of the holding surface 15a. If it becomes difficult for the focus ring 12 to follow the height difference of the holding surface 15a, a gap at the seal band 17 of the holding portion 15 becomes large. As a result, the leak amount of the cooling gas from the gap increases.

The holding surface 15a has a shape in which in the cross section in the thickness direction, the straight line connecting the first point corresponding to the innermost periphery 15d of the holding surface 15a and the second point corresponding to the outermost periphery 15e of the holding surface 15a always has a negative inclination from the first point toward the second point. That is, the holding surface does not have a portion (protrusion portion) protruding toward the focus ring 12 side or a portion (recess) recessed toward the cooling base 5 side, in the middle of the straight line connecting the first point and the second point.

In the holding surface 15a in the electrostatic chuck device 300 of this embodiment, similar to that in the electrostatic chuck device 10 of the first embodiment, the leak area of the inner peripheral surface 15b and the leak area of the outer peripheral surface 15c are less than 0.7 mm$^2$ (condition (ii)). The leak area of the inner peripheral surface 15b and the leak area of the outer peripheral surface 15c are preferably 0.6 mm$^2$ or less, and more preferably 0.5 mm$^2$ or less. The lower limit of the leak area can be optionally selected as necessary, and the example shown in the first embodiment can be used in the same manner.

Figure 8:
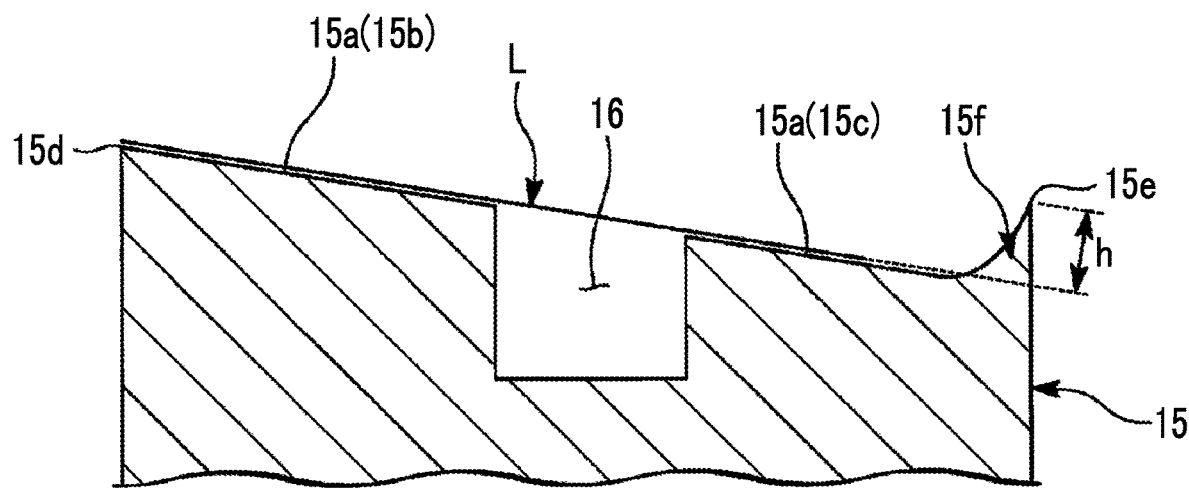
FIG. 8 is a schematic sectional view in an XZ plane showing an example of a shape having a ducktail at an outermost periphery of a holding surface in a holding portion of an electrostatic chuck device.

The holding surface 15a in the electrostatic chuck device 300 of this embodiment satisfies a condition of (in the cross section of the holding surface 15a in the thickness direction, a shortest distance h between the second point corresponding to the outermost periphery 15e of the outer peripheral surface 15c and a least squares straight line L which is obtained from the inner peripheral surface 15b and the outer peripheral surface 15c) <4 μm, as shown in FIG. 8. Hereinafter, this is sometimes referred to as a condition (iii).

The shortest distance h (in the cross section of the holding surface 15a in the thickness direction, the shortest distance h between the second point corresponding to the outermost periphery 15e of the outer peripheral surface 15c and the least squares straight line L which is obtained from the inner peripheral surface 15b and the outer peripheral surface 15c) is preferably 3 μm or less. The shortest distance h may be in a range of 0.0 μm or more and less than 4.0 μm, 0.0 μm or more and 3.8 μm or less, 0.1 μm or more and 3.5 μm or less, 0.1 μm or more and 3.3 μm or less, 0.2 μm or more and 3.0 μm or less, or the like, as necessary. When the shortest distance h is 4 μm or more, a gap is generated between the holding surface 15a of the holding portion 15 and the electrostatically attracted focus ring 12, and thus there is a possibility that the attraction force may decrease. If the attraction force between the focus ring 12 and the holding surface 15a decreases, the gap at the seal band 17 of the holding portion 15 increases, and thus the leak amount of the cooling gas from the gap increases. As shown in FIG. 8, a state (a portion thereof) where in the cross section of the holding surface 15a in the thickness direction, the height of the second point corresponding to the outermost periphery 15e of the outer peripheral surface 15c of the holding surface 15a is higher than the least squares straight line L from the centers of the inner peripheral surface 15b and the outer peripheral surface 15c of the holding surface 15a to the inner periphery is called a ducktail 15f.

Figure 9:
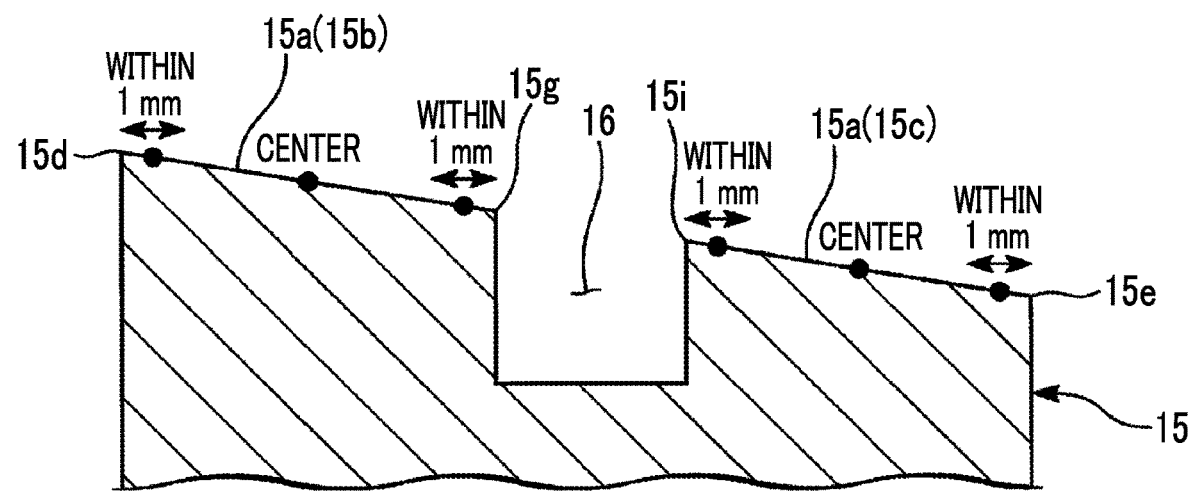
FIG. 9 is a schematic sectional view in an XZ plane showing a measurement position in three-dimensional coordinates on the holding surface of the holding portion of the electrostatic chuck device.

In the electrostatic chuck device 10 of this embodiment, the ducktail 15f of the holding surface 15a is measured using the three-dimensional measuring machine (trade name: Zyzax SVA NEX, manufactured by Tokyo Seimitsu Co., Ltd.) in accordance with JIS B 6191. In this measurement, first, the three-dimensional coordinates of the upper surfaces (holding surfaces) 15a of the outer seal band 17A and the inner seal band 17B in the width direction of the groove portion 16 are measured at three points on the inner peripheral surface 15b and three points on the outer peripheral surface 15c in the radial direction of the holding surface 15a are measured. Here, as shown in FIG. 9, with respect to the inner peripheral surface 15b, three-dimensional coordinates of the center (center point), any point (point a) within 1 mm from the innermost periphery 15d, and any point (point b) within 1 mm from a periphery 15g on the inner peripheral surface 15b side in the groove 16 are measured. Similarly, as shown in FIG. 9, with respect to the outer peripheral surface 15c, three-dimensional coordinates of the center, any point (point c) within 1 mm from the outermost periphery 15e, and any point (point d) within 1 mm from a periphery 15i on the outer peripheral surface 15c side in the groove 16 are measured. Further, 180 points are measured every 2° on the concentric circumference. That is, measurement is performed at 6×180 points. The measurement is preferably performed on a straight line passing through the center of the mounting surface.

Further, in the cross section of the holding surface 15a in the thickness direction, the shortest distance h between the second point corresponding to the outermost periphery 15e of the outer peripheral surface 15c and the least squares straight line L which is obtained from three points on the inner peripheral surface 15b and two points (points excluding the second point) on the outer peripheral surface 15c is measured at 180 points. Then, the maximum value of the measured values is adopted. In this embodiment, it is possible to provide an electrostatic chuck device having a small ducktail or no ducktail.

As described above, the holding surface 15a satisfies the conditions (i-ii) to (iii), whereby the gap between the holding surface 15a of the holding portion 15 and the focus ring 12 can be reduced. In this way, it is possible to reduce the amount of the cooling gas leaking from the gap. As a result, in this embodiment, it becomes easy to control the pressure of the cooling gas. Therefore, the electrostatic chuck device 300 facilitates temperature control of the focus ring 12, and can make the surface temperature of the plate-shaped sample W uniform.

Figure 10:
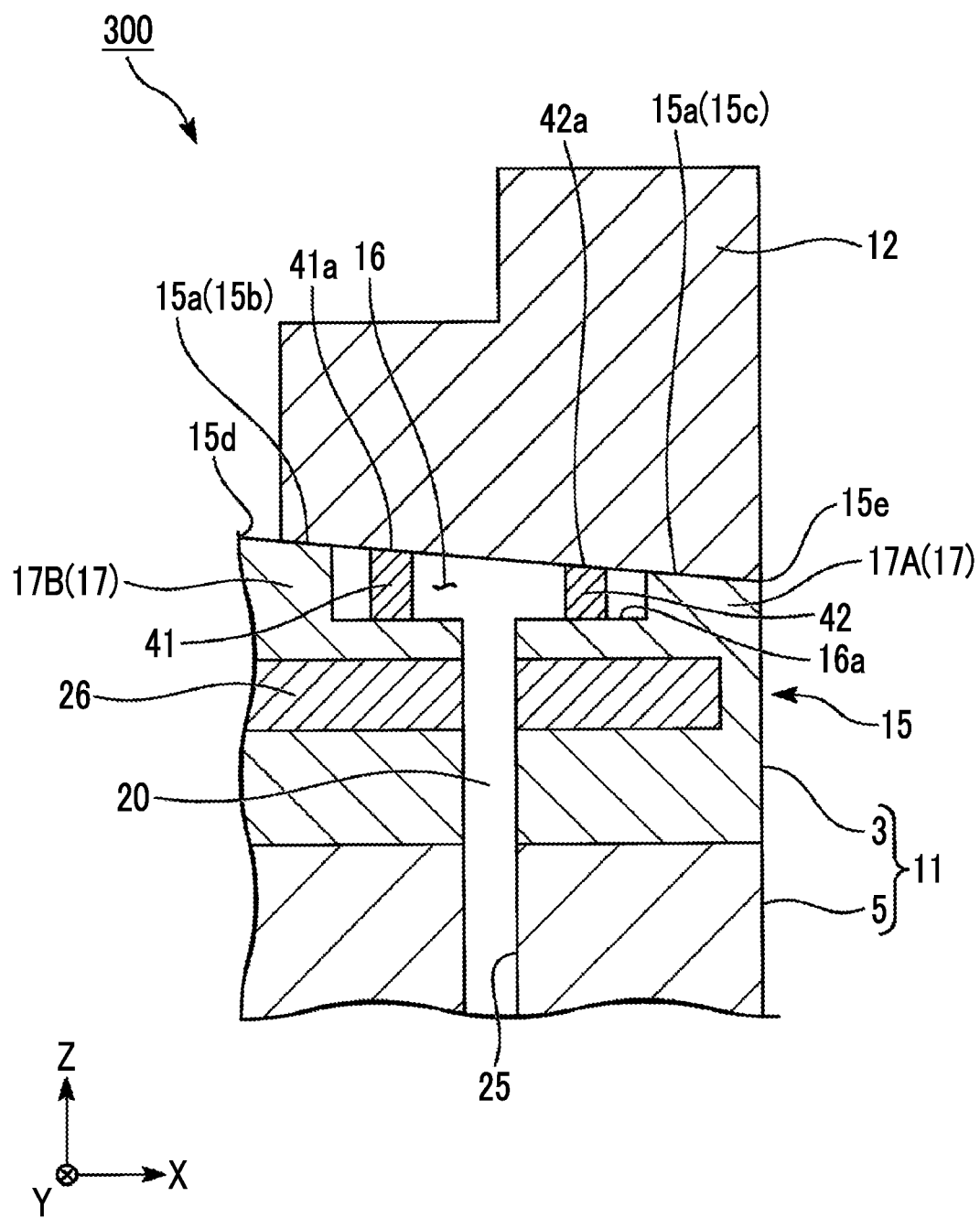
FIG. 10 is a schematic partial enlarged view in which the area indicated by β in FIG. 6 is enlarged.

Further, in the electrostatic chuck device 300 of this embodiment, as shown in FIG. 10, the columnar protrusion portions 41 and 42 extending in the thickness direction of the holding portion 15 may be provided on the bottom surface 16a of the groove portion 16. In the cross section of the holding surface 15a in the thickness direction, the heights to the upper surfaces 41a and 42a of the protrusion portions 41 and 42 with any horizontal reference plane (any horizontal reference plane corresponds to, for example, a platen surface on which an electrostatic chuck device is mounted in a three-dimensional measuring machine) as a reference is preferably equal to or less than the height of the straight line connecting the first point corresponding to the innermost periphery 15d of the holding surface 15a and the second point corresponding to the outermost periphery 15e of the holding surface 15a with the any horizontal reference plane as a reference.

In FIG. 10, a case where the two protrusion portions 41 and 42 are provided on the bottom surface 16a of the groove portion 16 is illustrated. However, the electrostatic chuck device 300 of this embodiment is not limited to this. In the electrostatic chuck device 300 of this embodiment, one or more protrusion portions may be provided only on the inner periphery side or the outer periphery side of the groove portion 16, and one or more protrusion portions may be provided on each of the inner periphery side and the outer periphery side of the groove portion 16. Further, an interval at which the protrusion portions are provided is not particularly limited.

According to the configuration described above, an electrostatic chuck device can be provided in which it is possible to make the surface temperature of the plate-shaped sample uniform.

<Electrostatic Chuck Device Manufacturing Method>

A manufacturing method for obtaining the electrostatic chuck device 300 described above will be described based on FIGS. 4 and 5.

The method of manufacturing the electrostatic chuck device of this embodiment preferably includes a grinding step, and a step of forming the groove portion 16. As steps other than the grinding step and the step of forming the groove portion 16, steps which are performed in known electrostatic chuck device manufacturing methods can be performed.

The electrostatic chuck device 300 of this embodiment can be manufactured in the same manner as the electrostatic chuck device 10 described above. The description of the same steps as those in the manufacturing method for obtaining the electrostatic chuck device 10 described above will be omitted.

In the grinding step in the method of manufacturing the electrostatic chuck device of this embodiment, the provisional mounting table 200 is ground such that the surface 150a around the mounting surface 11a satisfies, for example, the following conditions (i-ii) to (iii).

(i-ii) In the cross section of the sintered body 150 in the thickness direction, the straight line connecting a point corresponding to the innermost periphery 150d of the surface 150a and a point corresponding to the outermost periphery 150e of the surface 150a has a shape having a negative inclination from the point corresponding to the innermost periphery 150d of the surface 150a toward the point corresponding to the outermost periphery 150e of the surface 150a (a shape having a negative inclination from the point corresponding to the innermost periphery 150d of the surface 150a toward the point corresponding to the outermost periphery 150e of the surface 150a), and (a height of the point corresponding to the innermost periphery 150d of the surface 150a–a height of the point corresponding to the outermost periphery 150e of the surface 150a) is 0 µm or more and 10 µm or less.

(ii) The leak area of an inner peripheral surface 150b of the surface 150a and the leak area of an outer peripheral surface 150c of the surface 150a are less than 0.7 mm².

(iii) (in the cross section of the sintered body 150 in the thickness direction, the shortest distance h between the point corresponding to the outermost periphery 150e of the outer peripheral surface 150c and the least squares straight line L which is obtained from the inner peripheral surface 150b and the outer peripheral surface 150c) <4 µm.

The peripheral velocity of the grindstone G may be set to a velocity at which the surface 150a satisfies the above conditions (i-ii) to (iii), by performing a preliminary experiment.

The second embodiment of the present invention has been described above. However, the respective configurations, a combination thereof, and the like in this embodiment are examples, and addition, omission, replacement, and other changes of a configuration can be made within a scope which does not depart from the gist of the present invention. Further, the present invention is not limited by this embodiment.

EXAMPLE

Hereinafter, the present invention will be more specifically described by examples and comparative examples. However, the present invention is not limited to the following examples.

In the following examples and comparative examples, a He gas was used as the cooling gas.

[Measurement of Height Difference Between Innermost Periphery and Outermost Periphery of Holding Surface]

The three-dimensional measuring machine (trade name: Zyzax SVA NEX, manufactured by Tokyo Seimitsu Co., Ltd.) was used in accordance with JIS B 6191.

First, the three-dimensional coordinates of the outer upper surface (outer peripheral surface of the holding surface) and the inner upper surface (inner peripheral surface of the holding surface) in the width direction of the groove portion of the holding portion were measured with respect to an optionally selected point (point a) within 1 mm from the innermost periphery of the holding surface (inner peripheral surface) to the outer periphery side, and an optionally selected point (point d) within 1 mm from the outermost periphery of the holding surface (outer peripheral surface) to the inner periphery side. Further, 180 points were measured every 2° on the concentric circumference. That is, measurement of 2×180 points was performed.

In the electrostatic chuck devices of the examples and the comparative examples, with respect to the height difference, the difference between the height (point d) of the outermost periphery of the holding surface and the height (point a) of the innermost periphery of the holding surface was calculated at 180 points and the maximum value of the measured values was adopted.

[Measurement of Leak Area]

With respect to the three-dimensional coordinates of the center of the inner peripheral surface and the center of the outer peripheral surface of the holding surface, 180 points were measured every 2° on the concentric circumference in accordance with JIS B 6191 by using the three-dimensional measuring machine (trade name: Zyzax SVA NEX, manufactured by Tokyo Seimitsu Co., Ltd.).

A fitting line was calculated by the least squares method using any number of different sine curves, that is, a plurality of different sine curves having peaks and bottoms, in the circumferential direction of an angle. Specifically, three different sine curves having 1, 2, or 3 cycles were used. A curve (fitting line 2) obtained from the calculation result and a curve (fitting line 1) obtained from the actually measured data of the shape (dimensions) of the holding surface of the holding portion (three-dimensional data of the center of the inner peripheral surface and the center of the outer peripheral surface) were fitted to each other. Specifically, the difference between the curve obtained from the actually measured data of the shape (dimensions) of the holding surface of the holding portion and the fitting curve was assumed as a "shape that the focus ring cannot follow", and the difference was defined as the leak area.

[Evaluation of Leak Amount of He Gas]

The electrostatic chuck device was mounted on a plasma etching apparatus, and a silicon wafer (a ring-shaped sample) having a diameter of 350 mm was attracted and fixed to the mounting surface of the electrostatic chuck device with an applied direct-current voltage of 2.5 kV. At this time, a He gas was introduced through the gas holes at a pressure of 6.66 kPa, and the leak amount of the He gas was measured under the condition of vacuum (<0.5 Pa) and evaluated. A mass flow controller (manufactured by Fujikin) was used for the measurement of the leak amount, and the measurement was performed according to the conditions of a flow rate type leak test method.

In this evaluation, a case where the leak amount of the He gas is 3.0 sccm or less was evaluated as "○" (good). A case where the leak amount of the He gas is larger than 3.0 sccm and 3.3 sccm or less was evaluated as "Δ (acceptable)"

Further, a case where the leak amount of the He gas exceeds 3.3 sccm was evaluated as a defective product and was evaluated as "x (unacceptable)".

The unit, sccm, represents the flow rate (unit: $cm^3$) of a gas per minute under the conditions of 0.1 MPa and 0° C.

[Measurement of Ducktail]

The ducktail of the holding surface was measured in accordance with JIS B 6191 by using the three-dimensional measuring machine (trade name: Zyzax SVA NEX, manufactured by Tokyo Seimitsu Co., Ltd.).

In this measurement, first, the three-dimensional coordinates of the outer upper surface (outer peripheral surface of the holding surface) and the inner upper surface (inner peripheral surface of the holding surface) in the width direction of the groove portion of the holding portion were measured at three points on the inner peripheral surface and three points on the outer peripheral surface in the radial direction of the holding surface.

Here, with respect to the inner peripheral surface, three-dimensional coordinates were measured at the center (center point), any point (point a) within 1 mm from the innermost periphery, and any point (point b) within 1 mm from the periphery on the groove side. Similarly, with respect to the outer peripheral surface, three-dimensional coordinates were measured at the center (center point), any point (point c) within 1 mm from the outermost periphery, and any point (point d) within 1 mm from the periphery on the groove side. Further, 180 points were measured every 2° on the concentric circumference. That is, measurement of 6×180 points were performed.

Further, the shortest distance h from the outermost periphery of the outer peripheral surface to the least squares straight line L which is obtained from three points on the inner peripheral surface and two points (points excluding point d) on the outer peripheral surface in a case where the holding portion is viewed in a cross section in the thickness direction was measured at 180 points, and the maximum value of the measured values was adopted.

<Manufacturing of Electrostatic Chuck Device>

Example 1

A sintered body (φ350 mm, made of $Al_2O_3$—SiC) in which a through-hole was provided around a mounting surface, and which was provided with an electrode layer disposed in an electrostatic chuck portion and an electrode layer disposed in a holding portion, and a cooling base (made of aluminum) in which a through-hole was provided at a position planarly overlapping the through-hole of the sintered body were laminated with a silicone-based adhesive interposed therebetween. By heating this laminated body at 100° C. for 5 hours, the sintered body and the cooling base were bonded to each other.

Next, the surface of the sintered body around the mounting surface was ground in an annular shape by using a silicon carbide grindstone No. 1000 (grindstone) with a rotary grinder (grinding). As the silicon carbide grindstone, a grindstone whose length in the rotation axis direction is shorter than the length of the holding surface from an inner periphery to an outer periphery witch will be formed in a subsequent step was used. Further, with respect to the count of the silicon carbide grindstone, the larger the count, the smaller the abrasive grain becomes. Further, the peripheral velocity (rotational speed) of the grindstone in the grinding was set to 80 m/s. The width of the grindstone was set to 30% with respect to the length of the holding surface from the inner periphery to the outer periphery. Polishing was performed while moving the position of the grindstone.

Next, blast processing was performed on the ground surface around the mounting surface, and thus the sintered body was dug down to form a groove portion surrounding the mounting surface (a step of forming a groove portion). The blast processing was performed using a silicon carbide medium (400 mesh under (passing through 300 mesh)) under the condition of a discharge pressure of 0.03 MPa. In this way, an electrostatic chuck device of Example 1 was manufactured.

Due to the heat generation by the grinding, the attraction member and the cooling base are slightly deformed due to a difference in thermal expansion.

Although the reason is not clear, an individual which is deformed in a convex shape and an individual which is deformed in a concave shape are generated. In the case of Example 1, the electrostatic chuck device was considered to be deformed in a convex shape. That is, when the deformation returned at room temperature after the processing, the holding surface had a shape in which the outer periphery is higher than the inner periphery.

With respect to the upper surface (holding surface) in the width direction of the groove portion obtained after the step of forming a groove portion, (a) the height difference between the innermost periphery and the outermost periphery of the holding surface, (b) the leak area, (c) the ducktail, and (d) the leak amount of the He gas were measured. The results are shown in Table 1.

Example 2

As a result of carrying out the same operation as in Example 1, the holding surface had a shape in which the outer periphery is lower than the inner periphery. It is presumed that when the heat generation by the grinding caused a slight deformation due to the difference in thermal expansion between the attraction member and the cooling base, the deformation in a concave shape occurred.

Example 3

An electrostatic chuck device of Example 3 was manufactured in the same manner as in Example 1 except that the peripheral velocity of the grindstone in the grinding was set to 110 m/s.

Example 4

An electrostatic chuck device of Example 4 was manufactured in the same manner as in Example 1 except that the width of the grindstone in the grinding was set to 60% with respect to the length of the holding surface from the inner periphery to the outer periphery.

Example 5

An electrostatic chuck device of Example 5 was manufactured in the same manner as in Example 1 except that the width of the grindstone in the grinding was set to 60% with respect to the length of the holding surface from the inner periphery to the outer periphery and the peripheral velocity of the grindstone in the grinding was set to 140 m/s.

Comparative Example 1 (Reference Example)

An electrostatic chuck device of Comparative Example 1 was manufactured in the same manner as in Example 1 except that the width of the grindstone in the grinding was set to 100% with respect to the length of the holding surface from the inner periphery to the outer periphery.

Comparative Example 2

An electrostatic chuck device of Comparative Example 2 was manufactured in the same manner as in Example 1 except that the width of the grindstone in the grinding was set to 100% with respect to the length of the holding surface from the inner periphery to the outer periphery and the peripheral velocity of the grindstone in the grinding was set to 110 m/s.

Comparative Example 3

An electrostatic chuck device of Comparative Example 3 was manufactured in the same manner as in Example 1 except that the width of the grindstone in the grinding was set to 100% with respect to the length of the holding surface from the inner periphery to the outer periphery and the peripheral velocity of the grindstone in the grinding was set to 140 m/s.

The evaluation results of Examples 1 to 5 and Comparative Examples 1 to 3 are shown in Table 1.

TABLE 1

| | Height difference (absolute value) between innermost periphery and outermost periphery of holding surface [μm] | Ducktail [μm] | Leak area "inner peripheral surface/outer peripheral surface" [mm$^2$] | Leak amount of He gas [sccm] | Evaluation |
|---|---|---|---|---|---|
| Example 1 | 3.2 | 0 | 0.3/0.3 | 1.3 | ○ |
| Example 2 | 3.0 | 0 | 0.3/0.3 | 1.1 | ○ |
| Example 3 | 6.0 | 0 | 0.3/0.3 | 1.4 | ○ |
| Example 4 | 3.0 | 3.0 | 0/4/0.5 | 2.5 | ○ |
| Example 5 | 9.0 | 3.0 | 0/4/0.5 | 2.9 | ○ |
| Comparative Example 1 | 3.0 | 4.6 | 0/4/0.5 | 3.3 | X |
| Comparative Example 2 | 4.1 | 3.0 | 0.7/0.7 | 3.6 | X |

TABLE 1-continued

|  | Height difference (absolute value) between innermost periphery and outermost periphery of holding surface [μm] | Ducktail [μm] | Leak area "inner peripheral surface/outer peripheral surface" [mm²] | Leak amount of He gas [sccm] | Evaluation |
|---|---|---|---|---|---|
| Comparative Example 3 | 11.0 | 5.5 | 0.8/0.9 | 3.5 | X |

From the results of Table 1, it was found that in the electrostatic chuck devices of Examples 1 to 5 which satisfy the following conditions (i) and (ii) and Examples 1 to 5 which satisfy the following conditions (i) to (iii), the leak amount of the He gas was 2.9 sccm or less and the leak amount of the He gas was small. From this, it is considered that in the electrostatic chuck devices of Examples 1 to 5, the pressure of the He gas is easily controlled and it is possible to make the surface temperature of the wafer uniform.

(i) The holding surface has a shape in which when viewed in the cross section in the thickness direction, the straight line connecting the innermost periphery of the holding surface and the outermost periphery of the holding surface has a positive inclination from the innermost periphery toward the outermost periphery, or the straight line connecting the innermost periphery of the holding surface and the outermost periphery of the holding surface has a negative inclination from the innermost periphery toward the outermost periphery, and the height difference (absolute value) between the innermost periphery and the outermost periphery of the holding surface is 0 μm or more and 10 μm or less.

(ii) The leak area is less than 0.7 mm².

(iii) The ducktail is less than 4 μm.

On the other hand, it was found that in the electrostatic chuck devices of Comparative Example 3 which does not satisfy all the conditions (i) to (iii), Comparative Example 2 which does not satisfy the condition (ii), and Comparative Example 1 which does not satisfy the condition (iii), the leak amount of the He gas exceeds 3 sccm and the leak amount of the He gas is large. From this result, it is considered that in the examples, it is easier to make the surface temperature of the wafer uniform, than in the comparative examples. On the other hand, in the electrostatic chuck devices of Comparative Examples 2 and 3 in which the leak amount is particularly large, it is considered that it is difficult to control the pressure of the He gas and it is difficult to make the surface temperature of the wafer uniform.

From the above results, it was confirmed that the present invention is useful.

INDUSTRIAL APPLICABILITY

An electrostatic chuck device capable of making the surface temperature of a plate-shaped sample uniform can be provided.

REFERENCE SIGNS LIST

3: attraction member
5: cooling base
10, 300: electrostatic chuck device
11: mounting table
11a: mounting surface
12: focus ring
13: cooling element (cooling member)
14: electrostatic chuck portion of attraction member
15: holding portion
15a, 151a: upper surface (holding surface)
15b: inner peripheral surface further on the inner periphery side of holding surface than groove portion
15c: outer peripheral surface further on the outer periphery side of holding surface than groove portion
15d: innermost periphery of holding surface
15e: outermost periphery of holding surface
15f: ducktail of holding surface
15g: periphery on the inner peripheral surface side of groove
15i: periphery on the outer peripheral surface side of groove
16: groove portion
16a: bottom surface
17: seal band of holding portion
17A: outside portion in width direction of groove portion (outer seal band)
17B: inside portion in width direction of groove portion (inner seal band)
20: gas flow path
22: cooling gas supply source
23: pressure control valve
24: dielectric substrate
25: through-hole
26: electrode layer
26A: electrode layer disposed in electrostatic chuck portion
26B: electrode layer disposed in holding portion
27: power supply terminal
28: insulator
29: flow path of cooling base
30: recess
41, 42: protrusion portion provided on bottom surface of groove portion
41a, 42a: upper surface of protrusion portion
32, 132: insulator
150: sintered body
150a: surface around mounting surface
150b, 151b: inner peripheral surface of surface around mounting surface
150c, 151c: outer peripheral surface of surface around mounting surface
150d, 151d: innermost periphery of surface around mounting surface
150e, 151e: outermost periphery of surface around mounting surface
200: provisional mounting table
G1: grindstone
h: shortest distance
L: least squares straight line
W: plate-shaped sample

The invention claimed is:

1. An electrostatic chuck device comprising:
a mounting table provided with a mounting surface on which a plate-shaped sample is mounted;
a focus ring having an annular shape; and
a cooling element configured to cool the focus ring,
wherein the mounting table has a holding portion provided to surround the mounting surface,
the holding portion is provided with an annular groove portion surrounding the mounting surface, and a through-hole that is open on a bottom surface of the groove portion,
upper surfaces of the holding portion, which are located on both sides of the groove portion in a width direction, form a holding surface that comes into contact with the focus ring and holds the focus ring,
the holding surface is composed of an inner peripheral surface which is located further on an inner periphery side than the groove portion, and an outer peripheral surface which is located further on an outer periphery side than the groove portion, and
the holding surface satisfies following conditions (i) and (ii),
(i) the holding surface has a shape in which in a cross section in a thickness direction of the holding portion, a straight line connecting a first point corresponding to an innermost periphery of the holding surface and a second point corresponding to an outermost periphery of the holding surface has a positive inclination from the first point corresponding to the innermost periphery toward the second point corresponding to the outermost periphery, and
wherein in the cross section of the holding surface in the thickness direction, a difference between a height of the first point corresponding to the innermost periphery and a height of the second point corresponding to the outermost periphery is greater than or equal to 0 μm and less than or equal to 10 μm,
(ii) a leak area of the inner peripheral surface and a leak area of the outer peripheral surface are less than 0.7 mm².

2. The electrostatic chuck device according to claim 1, wherein the holding surface satisfies following condition (iii),
(iii) wherein, in the cross section of the holding surface in the thickness direction, a shortest distance between the second point corresponding to the outermost periphery and a least squares straight line that is obtained from the inner peripheral surface and the outer peripheral surface is less than 4 μm.

3. The electrostatic chuck device according to claim 2, wherein the shortest distance which is shown in the condition (iii) is 0 μm.

4. The electrostatic chuck device according to claim 1, wherein a plurality of protrusion portions extending in the thickness direction of the holding portion are provided on a bottom surface of the groove portion, and
in the cross section of the holding surface in the thickness direction, a height of an upper surface of the protrusion portion is equal to or less than a height of the straight line connecting the first point corresponding to the innermost periphery and the second point corresponding to the outermost periphery when a horizontal reference plane is used as a reference.

5. A method of manufacturing the electrostatic chuck device according to claim 1, comprising:

a step of preparing a provisional mounting table having a sintered body provided with a mounting surface on which a plate-shaped sample is mounted and having through-holes provided around the mounting surface;
a step of determining, with respect to a holding surface which mounts a focus ring thereon and is formed around the mounting surface, a length of the holding surface in a width direction, before forming the holding surface;
a step of selecting a grindstone in which a length in a rotation axis direction of the grindstone is shorter than the length of the holding surface in the width direction;
a grinding step of grinding a surface of the sintered body in an annular shape over a periphery of the mounting surface by using the grindstone to form a temporary holding surface that surrounds the mounting surface; and
a step of digging down the temporary holding surface of the sintered body to form a groove portion surrounding the mounting surface and form a holding surface having the groove portion.

6. The method of manufacturing the electrostatic chuck device according to claim 5, wherein
the step of determining a length in the width direction and the step of selecting a grindstone are performed before the step of preparing a provisional mounting table, and
the method further comprises, between the step of determining a length in the width direction and the step of selecting a grindstone, a step of obtaining conditions for manufacturing the electrostatic chuck which satisfies the condition (i) and the condition (ii) by preparing a plurality of grindstones having different widths and a plurality of different peripheral velocities and performing manufacture and evaluation of electrostatic chuck devices with the respective combinations thereof, and
the conditions are used in the step of selecting a grindstone and the grinding step.

7. The electrostatic chuck device according to claim 1, wherein in the cross section of the holding surface in the thickness direction, a difference between a height of the first point corresponding to the innermost periphery and a height of the second point corresponding to the outermost periphery is greater than or equal to 0.1 μm and less than or equal to 10 μm.

8. The electrostatic chuck device according to claim 1, wherein the leak area of the inner peripheral surface and the leak area of the outer peripheral surface are 0.6 mm² or less.

9. The method of manufacturing the electrostatic chuck device according to claim 1, wherein the difference between the height of the first point and the height of the second point is greater than or equal to 0.1 μm and less than or equal to 9.0 μm.

10. The method of manufacturing the electrostatic chuck device according to claim 1, wherein the difference between the height of the first point and the height of the second point is greater than or equal to 0.5 μm and less than or equal to 8.0 μm.

11. An electrostatic chuck device comprising:
a mounting table provided with a mounting surface on which a plate-shaped sample is mounted;
a focus ring having an annular shape; and
a cooling element configured to cool the focus ring,
wherein the mounting table has a holding portion provided to surround the mounting surface, the holding portion is provided with an annular groove portion surrounding the mounting surface, and a through-hole that is open on a bottom surface of the groove portion, upper surfaces of the holding portion, which are located on both sides of the groove portion in a width direction, form a holding surface that comes into contact with the focus ring and holds the focus ring, the holding surface is composed of an inner peripheral surface which is located further on an inner periphery side than the groove portion, and an outer peripheral surface which is located further on an outer periphery side than the groove portion, and the holding surface satisfies following conditions (i) and (ii), (i) the holding surface has a shape in which in a cross section in a thickness direction of the holding portion, a straight line connecting a first point corresponding to an innermost periphery of the holding surface and a second point corresponding to an outermost periphery of the holding surface has a negative inclination from the first point corresponding to the innermost periphery toward the second point corresponding to the outermost periphery, and wherein in the cross section of the holding surface in the thickness direction, a difference between a height of the first point corresponding to the innermost periphery and a height of the second point corresponding to the outermost periphery is greater than or equal to 0 μm and less than or equal to 9.0 μm, (ii) a leak area of the inner peripheral surface and a leak area of the outer peripheral surface are less than 0.7 mm².

12. The electrostatic chuck device according to claim 11, wherein the holding surface satisfies following condition (iii), (iii) wherein, in the cross section of the holding surface in the thickness direction, a shortest distance between the second point corresponding to the outermost periphery and a least squares straight line that is obtained from the inner peripheral surface and the outer peripheral surface is less than 4 μm.

13. The electrostatic chuck device according to claim 12, wherein the shortest distance which is shown in the condition (iii) is 0 μm.

14. The electrostatic chuck device according to claim 11, wherein a plurality of protrusion portions extending in the thickness direction of the holding portion are provided on a bottom surface of the groove portion, and in the cross section of the holding surface in the thickness direction, a height of an upper surface of the protrusion portion is equal to or less than a height of the straight line connecting the first point corresponding to the innermost periphery and the second point corresponding to the outermost periphery when a horizontal reference plane is used as a reference.

15. A method of manufacturing the electrostatic chuck device according to claim 11, comprising:

a step of preparing a provisional mounting table having a sintered body provided with a mounting surface on which a plate-shaped sample is mounted and having through-holes provided around the mounting surface;

a step of determining, with respect to a holding surface which mounts a focus ring thereon and is formed around the mounting surface, a length of the holding surface in a width direction, before forming the holding surface;

a step of selecting a grindstone in which a length in a rotation axis direction of the grindstone is shorter than the length of the holding surface in the width direction;

a grinding step of grinding a surface of the sintered body in an annular shape over a periphery of the mounting surface by using the grindstone to form a temporary holding surface that surrounds the mounting surface; and a step of digging down the temporary holding surface of the sintered body to form a groove portion surrounding the mounting surface and form a holding surface having the groove portion.

16. The method of manufacturing the electrostatic chuck device according to claim 15, wherein the step of determining a length in the width direction and the step of selecting a grindstone are performed before the step of preparing a provisional mounting table, and the method further comprises, between the step of determining a length in the width direction and the step of selecting a grindstone, a step of obtaining conditions for manufacturing the electrostatic chuck which satisfies the condition (i) and the condition (ii) by preparing a plurality of grindstones having different widths and a plurality of different peripheral velocities and performing manufacture and evaluation of electrostatic chuck devices with the respective combinations thereof, and the conditions are used in the step of selecting a grindstone and the grinding step.

17. The method of manufacturing the electrostatic chuck device according to claim 15, wherein the difference between the height of the first point and the height of the second point is greater than or equal to 0.1 μm and less than or equal to 9.0 μm.

18. The method of manufacturing the electrostatic chuck device according to claim 15, wherein the difference between the height of the first point and the height of the second point is greater than or equal to 0.5 μm and less than or equal to 8.0 μm.

19. The electrostatic chuck device according to claim 11, wherein in the cross section of the holding surface in the thickness direction, a difference between a height of the first point corresponding to the innermost periphery and a height of the second point corresponding to the outermost periphery is greater than or equal to 0.1 μm and less than or equal to 10 μm.

20. The electrostatic chuck device according to claim 11, wherein the leak area of the inner peripheral surface and the leak area of the outer peripheral surface are 0.6 mm² or less.

* * * * *